United States Patent
Sasaki et al.

(10) Patent No.: US 10,916,480 B2
(45) Date of Patent: *Feb. 9, 2021

(54) MAGNETIC WALL UTILIZATION TYPE ANALOG MEMORY DEVICE, MAGNETIC WALL UTILIZATION TYPE ANALOG MEMORY, NONVOLATILE LOGIC CIRCUIT, AND MAGNETIC NEURO DEVICE

(71) Applicant: TDK CORPORATION, Tokyo (JP)

(72) Inventors: Tomoyuki Sasaki, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/328,692

(22) PCT Filed: Dec. 26, 2017

(86) PCT No.: PCT/JP2017/046623
§ 371 (c)(1),
(2) Date: Feb. 26, 2019

(87) PCT Pub. No.: WO2018/189964
PCT Pub. Date: Oct. 18, 2018

(65) Prior Publication Data
US 2019/0189516 A1    Jun. 20, 2019

(30) Foreign Application Priority Data

Apr. 14, 2017  (JP) .................................. 2017-080413

(51) Int. Cl.
*H01L 21/8239* (2006.01)
*H01L 27/105* (2006.01)
(Continued)

(52) U.S. Cl.
CPC ........ *H01L 21/8239* (2013.01); *H01L 27/105* (2013.01); *H01L 29/82* (2013.01); *H01L 43/08* (2013.01); *H01L 43/10* (2013.01)

(58) Field of Classification Search
CPC ... H01L 21/8239; H01L 27/105; H01L 29/82; H01L 43/08; H01L 43/10
(Continued)

(56) References Cited

U.S. PATENT DOCUMENTS 9,489,618 B2    11/2016  Roy et al.
10,553,299 B2 *  2/2020  Sasaki ................... G11C 11/161
(Continued)

FOREIGN PATENT DOCUMENTS

JP    2006-269885 A    10/2006
JP       4413603 B2     2/2010
(Continued)

OTHER PUBLICATIONS

Sengupta et al., "A Vision for All-Spin Neural Networks: A Device to System Perspective," IEEE Transactions on Circuits and Systems-I: Regular Papers, Dec. 2016, vol. 63, No. 12, pp. 2267-2277.
(Continued)

*Primary Examiner* — Igwe U Anya
(74) *Attorney, Agent, or Firm* — Oliff PLC

(57) ABSTRACT

A magnetic wall utilization type analog memory device includes a magnetization fixed layer having a magnetization oriented in a first direction, a non-magnetic layer provided on one side of the magnetization fixed layer, a magnetic wall driving layer provided on the magnetization fixed layer with the non-magnetic layer interposed therebetween, a first magnetization supplying part which is configured to supply magnetization oriented in the first direction to the magnetic wall driving layer and a second magnetization supplying part which is configured to supply magnetization oriented in
(Continued)

a second direction reversed with respect to the first direction, wherein at least one of the first magnetization supplying part and the second magnetization supplying part is a spin-orbit torque wiring which comes into contact with the magnetic wall driving layer and extends in a direction intersecting the magnetic wall driving layer.

22 Claims, 8 Drawing Sheets

(51) Int. Cl.
*H01L 43/10* (2006.01)
*H01L 43/08* (2006.01)
*H01L 29/82* (2006.01)

(58) Field of Classification Search
USPC .......................................................... 257/314
See application file for complete search history.

(56) References Cited

U.S. PATENT DOCUMENTS

| | | |
|---|---|---|
| 2006/0227466 A1 | 10/2006 | Yagami |
| 2009/0296454 A1 | 12/2009 | Honda et al. |
| 2010/0157663 A1 | 6/2010 | Lee et al. |
| 2010/0193889 A1 | 8/2010 | Nagahara et al. |
| 2010/0237317 A1 | 9/2010 | Tsunoda |
| 2010/0237449 A1* | 9/2010 | Fukami .............. G11C 19/0808 257/421 |
| 2010/0265760 A1* | 10/2010 | Sakimura .............. H01L 27/226 365/158 |
| 2011/0116306 A1 | 5/2011 | Suzuki et al. |
| 2011/0129691 A1 | 6/2011 | Ishiwata et al. |
| 2012/0134199 A1* | 5/2012 | Zhu ........................ G11C 11/16 365/158 |
| 2014/0010004 A1* | 1/2014 | Suzuki .................... H01L 43/02 365/158 |
| 2014/0097509 A1* | 4/2014 | Fukami ................ H01L 27/228 257/421 |
| 2016/0125928 A1* | 5/2016 | Pileggi .................. G11C 11/161 365/158 |
| 2016/0247550 A1* | 8/2016 | Fukami .................... H01L 43/08 |

FOREIGN PATENT DOCUMENTS

| | | |
|---|---|---|
| JP | 2010-153022 A | 7/2010 |
| JP | 2012-039015 A | 2/2012 |
| JP | 5206414 B2 | 6/2013 |
| JP | 5486731 B2 | 5/2014 |
| JP | 2015-088669 A | 5/2015 |
| JP | 5750725 B2 | 7/2015 |
| JP | 2016-004924 A | 1/2016 |
| WO | 2009/072213 A1 | 6/2009 |
| WO | 2009/101827 A1 | 8/2009 |

OTHER PUBLICATIONS

Miron et al., "Perpendicular switching of a single ferromagnetic layer induced by in-plane current injection," Nature, Aug. 11, 2011, vol. 476, pp. 189-194.

Liu et al., "Spin torque switching with the giant spin Hall effect of tantalum," Science, 2012, vol. 336, 19 pages with 12 pages of supporting online materials.

Fukami et al., "A spin-orbit torque switching scheme with collinear magnetic easy axis and current configuration," Nature Nanotechnology, 2016, 6 pages.

Mar. 13, 2018 International Search Report issued in International Patent Application No. PCT/JP2017/046623.

May 16, 2019 Office Action issued in U.S. Appl. No. 15/945,119.

Sep. 24, 2019 Notice of Allowance issued in U.S. Appl. No. 15/945,119.

* cited by examiner

US 10,916,480 B2

MAGNETIC WALL UTILIZATION TYPE ANALOG MEMORY DEVICE, MAGNETIC WALL UTILIZATION TYPE ANALOG MEMORY, NONVOLATILE LOGIC CIRCUIT, AND MAGNETIC NEURO DEVICE

TECHNICAL FIELD

The present invention relates to a magnetic wall utilization type analog memory device, a magnetic wall utilization type analog memory, a nonvolatile logic circuit, and a magnetic neuro device.

Priority is claimed on Japanese Patent Application No. 2017-080413, filed Apr. 14, 2017, the content of which is incorporated herein by reference.

BACKGROUND ART

As a next-generation nonvolatile memory that replaces a flash memory or the like that has reached a limit with respect to miniaturization, a resistance change memory that records data using a resistance change device, for example, a magnetoresistive random access memory (MRAM), a resistance random access memory (ReRAM), a phase change random access memory (PCRAM) or the like is receiving attention.

As a method for achieving high density (large capacity) for a memory, there is a method of converting the recording bits per device constituting a memory into multiple values in addition to a method of decreasing the size of devices constituting a memory, and various multi-value converting methods have been proposed (for example, Patent Document 1 to 3).

One of MRAMs is called a magnetic wall driving type or magnetic wall shifting type (for example, Patent Document 4). The magnetic wall driving type MRAM performs writing of data by flowing a current in the in-plane direction of a magnetic wall driving layer (magnetization free layer) and shifting a magnetic wall according to a spin transfer effect due to spin-polarized electrons to reverse the magnetization of a ferromagnetic film to an orientation according to a direction of writing current.

Patent Document 4 discloses a multi-value recording and analog recording method with respect to a magnetic wall driving type MRAM.

For an MRAM, different data writing methods have been proposed, and magnetic field writing type, yoke magnetic field writing type, spin transfer torque (STT) type, spin orbit torque (SOT) type MRAMs and the like are known in addition to the magnetic wall driving type MRAM.

In Patent Document 5, only a function equivalent to reading a conventional binary memory is proposed for the purpose of detecting a current of a bit line instead of recording information.

CITATION LIST

Patent Literature

[Patent Document 1]
  Japanese Unexamined Patent Application, First Publication No. 2015-088669(A)
[Patent Document 2]
  WO 2009/072213(A)
[Patent Document 3]
  Japanese Unexamined Patent Application, First Publication No. 2016-004924(A)
[Patent Document 4]
  WO 2009/101827(A)
[Patent Document 5]
  U.S. Pat. No. 9,489,618(B)

SUMMARY OF INVENTION

Technical Problem

FIG. 13 shows a schematic cross-sectional view of an example of a magnetoresistive sensor part included in a conventional magnetic wall driving type MRAM.

The conventional configuration shown in FIG. 13 includes a magnetization fixed layer 111 having a magnetization oriented in a first direction, a non-magnetic layer 112 provided on one side of the magnetization fixed layer 111, a magnetic wall driving layer 113 that has a magnetic wall DW and is composed of a first region 113a, a second region 113b and a third region 113c positioned between these regions, a first magnetization supply layer 114 which comes into contact with the first region 113a and has a first magnetization direction, and a second magnetization supply layer 115 which comes into contact with the second region and has a second magnetization direction reversed with respect to the first magnetization direction.

In FIG. 13, arrows M11, M14 and M15 show magnetization directions of the respective layers and arrows M13a and M13b respectively show a magnetization direction of the portion of the magnetic wall driving layer 113 on the side of the first magnetization supply layer 114 having the magnetic wall DW as a boundary and a magnetization direction of the portion of the magnetic wall driving layer 113 on the side of the second magnetization supply layer 115 having the magnetic wall DW as a boundary.

As shown in FIG. 13, the conventional magnetic wall driving type MRAM includes magnetization fixed layers (the first magnetization supply layer 114 and the second magnetization supply layer 115) bonded to magnetization fixed regions in order to provide the magnetization fixed regions (the first region 113a and the second region 113b) at both edges of the magnetic wall driving layer. When such a configuration is caused to function as an MRAM or a neuromorphic device, the magnetization needs to be fixed in at least two magnetization directions. Further, three types of magnetic layered structure are necessary as an electrode structure. Regarding conditions for forming these structures, forming on a flat surface and vacuum consistent film forming are generally assumed. However, manufacturing methods that meet these conditions have not been proposed.

An object of the present invention devised in view of the aforementioned circumstances is to provide a magnetic wall utilization type analog memory device, a magnetic wall utilization type analog memory, a nonvolatile logic circuit and a magnetic neuro device which do not require at least one of the two magnetization fixed layers included in conventional magnetic wall driving type MRAMs.

Solution to Problem

In order to achieve the aforementioned objects, the present invention provides the following means.

(1) A magnetic wall utilization type analog memory device according to a first aspect of the present invention includes: a magnetization fixed layer having a magnetization oriented in a first direction; a non-magnetic layer provided on one side of the magnetization fixed layer; a magnetic wall driving layer provided on the magnetization fixed layer with the non-magnetic layer interposed therebetween; and a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer, wherein at least one of the first magnetization supplying part and the second magnetization supplying part is a spin-orbit torque wiring which comes into contact with the magnetic wall driving layer and extends in a direction intersecting the magnetic wall driving layer.

(2) In the magnetic wall utilization type analog memory device according to (1), the spin-orbit torque wiring may be provided at the position closer to a substrate than the magnetic wall driving layer (on the side opposite the side in contact with the non-magnetic layer of the magnetic wall driving layer).

(3) A magnetic wall utilization type analog memory device according to a second aspect of the present invention includes: a magnetization fixed layer having magnetization oriented in a first direction; a non-magnetic layer provided on one side of the magnetization fixed layer; a magnetic wall driving layer provided on the magnetization fixed layer having the non-magnetic layer interposed therebetween; and a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer, wherein at least one of the first magnetization supplying part and the second magnetization supplying part is a magnetic field application wiring which is electrically insulated from the magnetic wall driving layer and extends in a direction intersecting the magnetic wall driving layer (the longitudinal direction of the magnetic wall driving layer).

(4) In the magnetic wall utilization type analog memory device according to the aspect disclosed in (3), the magnetic field application wiring may be disposed to be able to supply in-plane magnetization of the magnetic wall driving layer.

(5) In the magnetic wall utilization type analog memory device according to the aspect disclosed in (3), the magnetic field application wiring may be disposed to be able to supply surface-perpendicular magnetization of the magnetic wall driving layer.

(6) A magnetic wall utilization type analog memory device according to a third aspect of the present invention includes: a magnetization fixed layer having a magnetization oriented in a first direction; a non-magnetic layer provided on one side of the magnetization fixed layer; a magnetic wall driving layer provided on the magnetization fixed layer with the non-magnetic layer interposed therebetween; and a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer, wherein at least one of the first magnetization supplying part and the second magnetization supplying part is a voltage applying part which is connected to the magnetic wall driving layer through an insulating layer.

(7) The magnetic wall utilization type analog memory device according to the aforementioned aspects may further include a current controlling part which is configured to flow a current between the magnetization fixed layer and a region of the magnetic wall driving layer in which magnetization is oriented in the second direction reversed with respect to the first direction during readout.

(8) A magnetic wall utilization type analog memory according to a fourth aspect of the present invention includes a plurality of magnetic wall utilization type analog memory devices according to the aforementioned aspects.

(9) A nonvolatile logic circuit according to a fifth aspect of the present invention includes: a magnetic wall utilization type analog memory in which magnetic wall utilization type analog memory devices according to the aspects are disposed in the form of an array; and an STT-MRAM positioned inside or outside the array, wherein the nonvolatile logic circuit has a storage function and a logic function and includes the magnetic wall utilization type analog memory devices and the STT-MRAM for the storage function.

(10) A magnetic neuro device according to the fifth aspect of the present invention includes: the magnetic wall utilization type analog memory device according to the aforementioned aspects, wherein the magnetic wall driving layer has a first storage part extending in a longitudinal direction, and a second storage part and a third storage part having the first storage part interposed therebetween; and a current source having a control circuit which is configured to control flowing of a writing current capable of sequentially shifting a magnetic wall such that the magnetic wall stops in all of the first storage part, the second storage part and the third storage part at least once.

Advantageous Effects of Invention

According to the magnetic wall utilization type analog memory device of the present invention, it is possible to provide a magnetic wall utilization type analog memory device that does not require at least one of the two magnetization fixed layers included in the conventional magnetic wall driving type MRAM.

DESCRIPTION OF EMBODIMENTS

Hereinafter, the configuration of the present embodiment will be described using the drawings. The drawings used in the following description may have enlarged characteristic parts for convenience in order to facilitate easy understanding of characteristics, and dimension proportions and the like of respective components are not limited to actual ones. In addition, materials, dimensions and the like exemplified in the following description are examples and the present invention is not limited thereto.

(Magnetic Wall Utilization Type Analog Memory Device)

Figure 1:
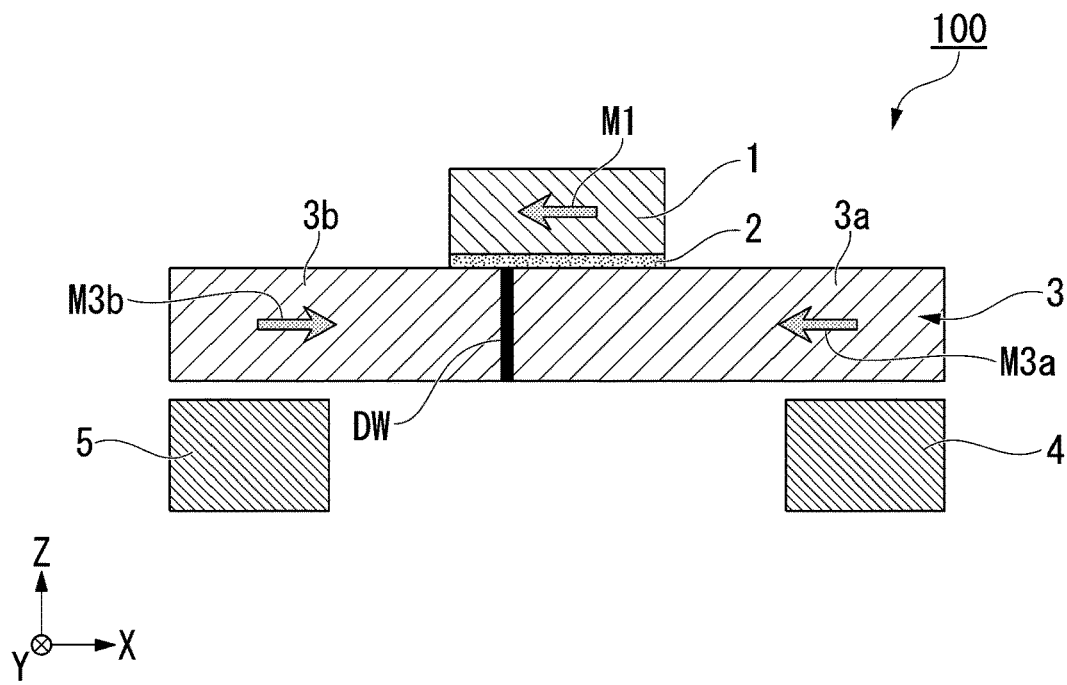
FIG. 1 is a schematic cross-sectional view of an example of a magnetic wall utilization type analog memory device according to the present invention.

FIG. 1 is a schematic cross-sectional view of an example of a magnetic wall utilization type analog memory device according to the present invention. The magnetic wall utilization type analog memory device shown in FIG. 1 includes a magnetization fixed layer 1, a non-magnetic layer 2, a magnetic wall driving layer 3, a first magnetization supplying part 4, and a second magnetization supplying part 5.

The first magnetization supplying part 4 and the second magnetization supplying part 5 are means capable of locally causing magnetization reversal (supplying magnetization) in the magnetic wall driving layer 3.

Although the first magnetization supplying part 4 and the second magnetization supplying part 5 are arranged to be separated from the magnetic wall driving layer 3 in FIG. 1, this is an embodiment and the first magnetization supplying part 4 and the second magnetization supplying part 5 may be directly bonded to the magnetic wall driving layer 3 according to a specific means or bonded thereto with a layer in the magnetic wall utilization type analog memory device of the present invention therebetween.

A layer lamination direction, that is, a direction perpendicular to a principal surface of each layer (surface-perpendicular direction), is defined as a Z direction in FIG. 1. Each layer is formed parallel to the XY plane perpendicular to the Z direction.

Magnetization Fixed Layer

The magnetization fixed layer 1 is a layer having magnetization M1 oriented and fixed in a first direction. Here, fixing of magnetization means that a magnetization direction does not change (magnetization is fixed) before and after writing using a writing current.

Meanwhile, in the present description, "directions" of the "first direction" and "second direction" are used to refer to different directions when the directions are different even when they are parallel to each other and refer to the same direction when they are parallel and identical to each other.

In the example shown in FIG. 1, the magnetization fixed layer 1 is an in-plane magnetic film in which magnetization M1 has in-plane magnetic anisotropy (in-plane easy magnetization axis). The magnetization fixed layer 1 is not limited to an in-plane magnetic film and may be a perpendicular magnetic film having perpendicular magnetic anisotropy (perpendicular easy magnetization axis).

When the magnetization fixed layer 1 is an in-plane magnetic film, it has a high MR ratio, is hardly affected by a spin transfer torque (STT) during readout and can increase a reading voltage. On the other hand, when the device needs to be miniaturized, it is desirable to use a perpendicular magnetic film having a large magnetic anisotropy and a small demagnetizing field. A perpendicular magnetic film has high resistance to heat disturbance and thus data it is difficult for data to be erased therefrom.

Known materials can be used for the magnetization fixed layer 1. For example, a metal selected from a group consisting of Cr, Mn, Co, Fe and Ni and an alloy including one or more of such metals and having ferromagnetism can be used. In addition, these metals and an alloy including at least one of B, C and N can also be used. Specifically, Co—Fe and Co—Fe—B are conceivable.

In addition, a Heusler alloy such as $Co_2FeSi$ can also be used for the magnetization fixed layer 1.

A Heusler alloy includes an intermetallic compound having a chemical composition of $X_2YZ$, wherein X is a transition metal element or a noble metal element from the Co, Fe, Ni or Cu group in the periodic table, Y is a transition metal from the Mn, V, Cr or Ti group and can also have element types for X, and Z is a typical element from Group III to Group V. For example, $Co_2FeSi$, $Co_2MnSi$, $Co_2Mn_{1-a}Fe_aAl_bSi_{1-b}$ and the like are conceivable.

Further, the magnetization fixed layer 1 may be a synthetic structure composed of an antiferromagnetic layer, a ferromagnetic layer and a non-magnetic layer. In the synthetic structure, the magnetization direction of the magnetization fixed layer 1 is strongly held by the antiferromagnetic layer. Accordingly, there is hardly any external influence on the magnetization of the magnetization fixed layer 1.

When magnetization of the magnetization fixed layer 1 is oriented in the XY plane (the magnetization fixed layer 1 is an in-plane magnetic film), it is desirable to use NiFe, for example. On the other hand, when magnetization of the magnetization fixed layer 1 is oriented in the Z direction (the magnetization fixed layer 1 is a perpendicular magnetic film), it is desirable to use a Co/Ni laminated layer, a Co/Pt laminated layer and the like, for example. For example, when the magnetization fixed layer 1 is formed of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm), the magnetization fixed layer 1 becomes a perpendicular magnetic film.

Non-Magnetic Layer

The non-magnetic layer 2 is provided on one side of the magnetization fixed layer 1. The magnetic wall utilization type analog memory device 100 reads a change in a magnetization state of the magnetic wall driving layer 3 with respect to the magnetization fixed layer 1 as a resistance value change through the non-magnetic layer 2. That is, the magnetization fixed layer 1, the non-magnetic layer 2, and the magnetic wall driving layer 3 function as a magnetoresistive effect element which has a configuration similar to a tunnel magnetoresistive (TMR) element when the non-magnetic layer 2 is an insulator and a configuration similar to a gigantic magnetoresistive (GMR) element when the non-magnetic layer 2 is formed of a metal.

A known material capable of being used for a non-magnetic layer of a magnetoresistive effect element can be used as a material of the non-magnetic layer 2. When the non-magnetic layer 2 is formed of an insulator (the non-magnetic layer 2 is a tunnel barrier layer), $Al_2O_3$, $SiO_2$, MgO, $MgAl_2O_4$, $ZnAl_2O_4$, $MgGa_2O_4$, $ZnGa_2O_4$, $MgIn_2O_4$, $ZnIn_2O_4$, a multilayered film or a mixed composition film of these materials, and the like can be used as a material thereof. Further, in addition to these materials, materials in which some of Al, Si and Mg have been replaced by Zn, Be and the like can also be used. Among these materials, MgO and $MgAl_2O_4$ are materials that can realize a coherent tunnel and thus can inject spins with high efficiency. On the other hand, when the non-magnetic layer 2 is formed of a metal, Cu, Al, Ag and the like can be used as a material thereof.

Magnetic Wall Driving Layer 3

The magnetic wall driving layer 3 is a magnetization free layer formed of a ferromagnetic material and a magnetization direction inside thereof is reversible. The magnetic wall driving layer 3 includes a first region 3a in which magnetization M3a is the same as that of the magnetization fixed layer 1 and is oriented in the first direction, a second region 3b in which magnetization M3b is oriented in a second direction reversed with respect to the first direction, and a magnetic wall DW that forms the interface of these regions. Magnetization directions of the first region 3a and the second region 3b having the magnetic wall DW interposed therebetween are reverse to each other. The magnetic wall DW is shifted according to changes in the composition ratio of the first region 3a and the second region 3b in the magnetic wall driving layer 3.

As a material of the magnetic wall driving layer 3, a known material capable of being used for a magnetization free layer of a magnetoresistive effect element can be used and particularly a soft magnetic material can be applied. For example, a metal selected from a group consisting of Cr, Mn, Co, Fe and Ni, an alloy including one or more of these metals, an alloy including these metals and at least one of B, C and N, etc. can be used. Specifically, Co—Fe, Co—Fe—B and Ni—Fe are conceivable as a material of the magnetic wall driving layer 3.

Materials having low saturation magnetization can also be used as a material of the magnetic wall driving layer 3. For example, MnGaAs and InFeAs have low saturation magnetization and thus can drive a magnetic wall with a low current density. Further, since magnetic wall driving speeds of such materials are low, it is desirable to use such materials in an analog memory. In a material having weak magnetic anisotropy, such as NiFe, a magnetic wall driving speed is high and operation is performed at a speed of 100 m/sec or higher. That is, shifting a distance of 1 μm is achieved with a 10 nsec pulse. Accordingly, when the magnetic wall driving layer is operated in a device in an analog manner, a countermeasure of applying a minute pulse using an expensive semiconductor circuit, sufficiently lengthening the magnetic wall driving layer at the sacrifice of a degree of integration, or the like is required. In the case of materials having low magnetic wall driving speeds, an analog memory can be formed using a device having a current with a sufficiently long pulse and a short magnetic wall driving layer.

A perpendicular magnetic film of $Mn_3X$ (X=Ga, Ge) or a perpendicular magnetic film according to a multi-layered film of Co/Ni, Co/Pt or the like is desirable for the material of the magnetic wall driving layer 3. Such materials have a low current density for magnetic wall driving but they can drive a magnetic wall.

It is desirable that the length of the magnetic wall driving layer 3 which extends in the X direction be equal to or greater than 60 nm. In the case of lengths of 60 nm or less, the magnetic wall driving layer 3 easily becomes a single domain and it is difficult for the magnetic wall DW to be formed in the magnetic wall driving layer 3.

Although the thickness of the magnetic wall driving layer 3 is not particularly limited as long as it serves as a magnetic wall driving layer, the thickness can be set to 2 to 60 nm, for example. When the thickness of the magnetic wall driving layer 3 is equal to or greater than 60 nm, the magnetic wall becomes more likely to be formed in the lamination direction. However, whether the magnetic wall is formed in the lamination direction depends on the balance with respect to the shape anisotropy of the magnetic wall driving layer 3. If the thickness of the magnetic wall driving layer 3 is less than 60 nm, it is unlikely that the magnetic wall DW will be formed.

The magnetic wall driving layer 3 may have a magnetic wall pin retaining part for stopping shifting of the magnetic wall DW at the side of the layer.

For example, when a prominence and depression, a groove, a bump, a narrow part, an indented part or the like is provided at a position at which shifting of the magnetic wall DW of the magnetic wall driving layer 3 is intended to be stopped, it is possible to stop (pin) shifting of the magnetic wall. When the magnetic wall driving layer 3 has the magnetic wall pin retaining part, a configuration in which the magnetic wall does not shift any more unless a current equal to or greater than a threshold value flows can be formed and an output signal is easily converted into multiple values instead of being analog.

For example, it is possible to hold the magnetic wall DW more stably by forming the magnetic wall pin retaining part for respective predetermined distances, which facilitates stable multi-value recording and more stable reading of an output signal converted into multiple values.

First Magnetization Supplying Part and Second Magnetization Supplying Part

Figure 13:
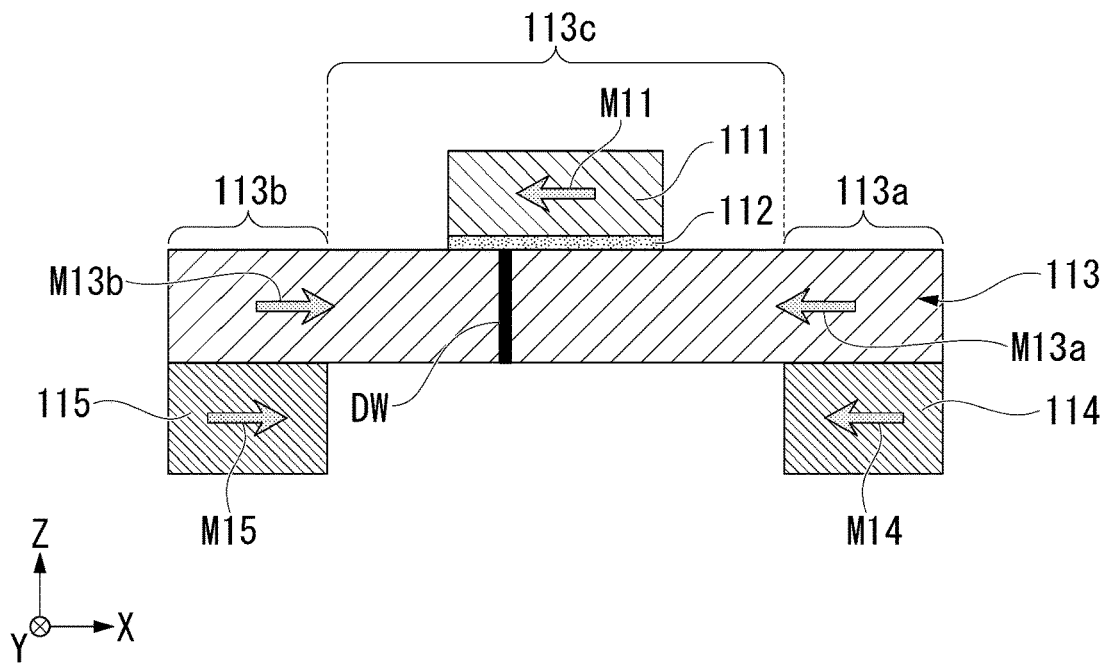
FIG. 13 is a schematic cross-sectional view of an example of a conventional magnetic wall utilization type analog memory device.

In the conventional magnetic wall driving type MRAM shown in FIG. 13, all means corresponding to the first magnetization supplying part 4 and the second magnetization supplying part 5 shown in FIG. 1 are magnetization supply layers in which magnetization has been fixed (refer to the first magnetization supply layer 114 and the second magnetization supply layer 115 of FIG. 13).

On the other hand, the magnetic wall utilization type analog memory device of the present invention differs from the conventional magnetic wall driving type MRAM shown in FIG. 13 in that at least one of the first magnetization supplying part 4 and the second magnetization supplying part 5 is not a magnetization supplying part (magnetization supply layer) in which magnetization has been fixed and is a magnetization supplying part which will be described layer. The other magnetization supplying part may be a magnetization supply layer in which magnetization has been fixed as shown in FIG. 13.

To allow easy understanding of the magnetic wall utilization type analog memory device of the present invention, the conventional magnetic wall driving type MRAM will be described first with reference to FIG. 13.

In the conventional magnetic wall driving type MRAM, a writing current flows through the first magnetization supply layer 114 or the second magnetization supply layer 115 and thus magnetization is supplied from the first magnetization supply layer 114 or the second magnetization supply layer 115 to the magnetic wall driving layer 113.

Both the first magnetization supply layer 114 and the second magnetization supply layer 115 are layers (ferromagnetic layers) formed of a ferromagnetic material in which magnetization has been fixed. Magnetization M14 of the first magnetization supply layer 114 is oriented in the same direction as magnetization M3a of the first region 3a of the magnetic wall driving layer 113 which comes into contact with the first magnetization supply layer 114. That is, magnetization M14 of the first magnetization supply layer 114 is oriented in the same direction as magnetization M1 of the magnetization fixed layer 111. On the other hand, magnetization M15 of the second magnetization supply layer 115 is oriented in the same direction as magnetization M3b of the second region 3b of the magnetic wall driving layer 113 which comes into contact with the second magnetization supply layer 115. That is, magnetization M15 of the second magnetization supply layer 115 is oriented in a direction reversed with respect to magnetization M1 of the magnetization fixed layer 111.

Magnetization directions in portions of the magnetic wall driving layer 113 which come into contact with the first magnetization supply layer 114 and the second magnetization supply layer 115 are not rewritten in normal use because the first magnetization supply layer 114 and the second magnetization supply layer 115 are magnetically coupled to the magnetic wall driving layer 113 and stabilized. Accordingly, when the first magnetization supply layer 114 and the second magnetization supply layer 115 are used as magnetization supplying part, the magnetic wall DW is not shifted outward (X direction) from the portions in contact with the first magnetization supply layer 114 and the second magnetization supply layer 115 in normal use even if the magnetic wall DW is caused to be shifted. It is possible to prevent the magnetic wall DW from disappearing and prevent the magnetic wall driving layer 113 from becoming a single domain during operation by limiting a range in which the magnetic wall DW can be shifted.

Although the aforementioned advantages are present, the above-described problem is also present and thus the present invention solves such a problem.

Figure 2:
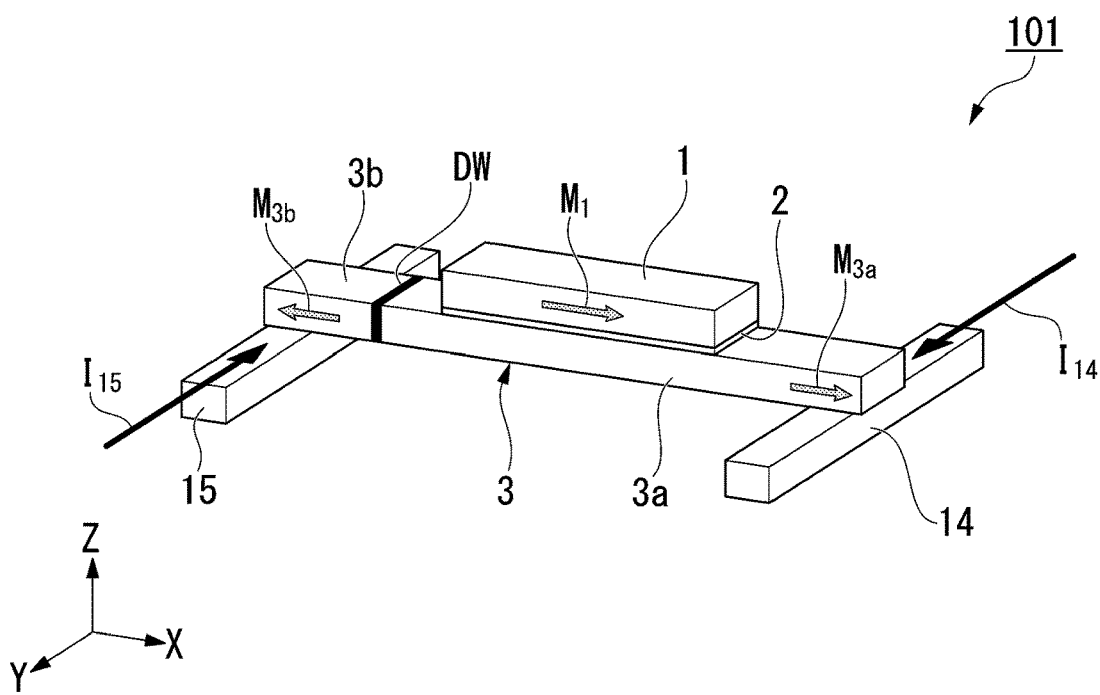
FIG. 2 is a schematic perspective view of a magnetic wall utilization type analog memory device according to a first embodiment of the present invention.

FIG. 2 shows a schematic perspective view of a magnetic wall utilization type analog memory device according to a first embodiment of the present invention.

The first magnetization supplying part 4 and the second magnetization supplying part 5 included in the magnetic wall utilization type analog memory device of the first embodiment will be described with reference to FIG. 2.

In the magnetic wall utilization type analog memory device 101, magnetization supplying part are a first spin-orbit torque wiring 14 and a second spin-orbit torque wiring 15 which are bonded to the magnetic wall driving layer 3 and extend in a direction intersecting the magnetic wall driving layer 3. Hereinafter, the first spin-orbit torque wiring 14 and the second spin-orbit torque wiring 15 may be collectively called a spin-orbit torque wiring.

The magnetic wall utilization type analog memory device 101 having such a configuration can introduce a magnetic wall into the magnetic wall driving layer by flowing a current to both ends of the spin-orbit torque wiring without a magnetization fixed layer being provided and cause the magnetic wall to be shifted by flowing a current through the magnetic wall driving layer through the spin-orbit torque wiring.

The spin-orbit torque wiring is formed of a material in which a pure spin current is generated according to a spin Hall effect when a current flows. The material forming the spin-orbit torque wiring is not limited to a material composed of a single element and may be a material composed of a portion formed of a material in which a pure spin current is generated and a portion formed of a material in which a pure spin current is not generated, and the like.

The spin-orbit torque wiring may include a non-magnetic heavy metal. Here, a heavy metal is used to mean a metal having a specific gravity equal to or greater than that of yttrium. The spin-orbit torque wiring may be formed of only a non-magnetic heavy metal.

In this case, it is desirable that the non-magnetic heavy metal be a non-magnetic metal having an atomic number equal to or greater than 39 which has d electrons or f electrons in the outermost shell. This is because such a non-magnetic metal has a considerable spin-orbit interaction that causes a spin Hall effect to occur. The spin-orbit torque wiring may be formed of only a non-magnetic metal having an atomic number equal to or greater than 39 which has d electrons or f electrons in the outermost shell.

When a current flows through a metal, all electrons generally move in a direction reversed with respect to the current irrespective of spin directions thereof whereas, in a non-magnetic metal having a large atomic number which has d electrons and f electrons in the outmost shell, movement directions of electrons depend on spin directions thereof according to the spin Hall effect and a pure spin current is easily generated because a spin-orbit interaction is considerable. Further, a metal alloy is preferable. Since an alloy has different metal elements present in one structure, symmetry of the crystal structure deteriorates and thus a pure spin current is easily generated. Further, it is desirable that atomic numbers of metal elements of an alloy be sufficiently different. In this case, the orbits of metal elements to which electrons are brought to change greatly and thus a pure spin current is generated more easily.

In addition, the spin-orbit torque wiring may include a magnetic metal. The magnetic metal refers to a ferromagnetic metal or an antiferromagnetic metal. When a small amount of magnetic metal is included in a non-magnetic metal, a spin-orbit interaction is enhanced and thus a spin current generation efficiency with respect to current flowing through the spin-orbit torque wiring can be increased. The spin-orbit torque wiring may be formed of only an antiferromagnetic metal.

Since the spin-orbit interaction occurs due to the inherent inner field of the substance of the spin-orbit torque wiring material, a pure spin current is generated even in a non-magnetic material. When a small amount of magnetic metal is added to a spin-orbit torque wiring material, the magnetic metal itself scatters flowing electron spins and thus spin current generation efficiency is improved. However, when the amount of addition of the magnetic metal excessively increases, the generated pure spin current is scattered by the added magnetic metal and, as a result, operation of decreasing the spin current is strengthened. Accordingly, it is desirable that the mole ratio of the added magnetic metal be sufficiently lower than the mole ratio of the main ingredient of the spin-orbit torque wiring. At a rough estimate, it is desirable that the mole ratio of the added magnetic metal be equal to or less than 3%.

In addition, the spin-orbit torque wiring may include a topological insulator. The spin-orbit torque wiring may be formed of only a topological insulator. The topological insulator is a substance inside of which is an insulator or a large resistance and which has a spin-polarized metal state generated on the surface thereof. The substance includes an internal magnetic field that is called a spin orbital interaction. Accordingly, a new topological phase is expressed according to a spin orbital interaction effect even if there is no external magnetic field. This is a topological insulator, and a pure spin current can be generated with high efficiency according to a strong spin-orbit interaction and breakdown of inversion symmetry at an edge.

As a topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$ and the like are desirable. These topological insulators can generate a spin current with high efficiency.

It is desirable that the spin-orbit torque wiring be provided at the position closer to a substrate (not shown) rather than the magnetic wall driving layer 3. When the spin-orbit torque wiring is present under the magnetic wall driving layer 3, the surface of the spin-orbit torque wiring can be flattened and thus it is possible to prevent a spin current at the interface between the magnetic wall driving layer and a spin-orbit torque layer from scattering and cause local magnetization reversal with a low current density.

(Other Components)

A magnetic coupling layer may be provided between the magnetic wall driving layer 3 and the non-magnetic layer 2. The magnetic coupling layer is a layer that transfers a magnetization state of the magnetic wall driving layer 3. A major function of the magnetic wall driving layer 3 is a layer for driving the magnetic wall and is not limited to selecting a material suitable for magnetoresistive effect occurring through the magnetization fixed layer 1 and the non-magnetic layer 2. In general, it is known that ferromagnetic materials in a BCC structure are suitable for the magnetization fixed layer 1 and the magnetic coupling layer in order to cause the coherent tunnel effect to occur using the non-magnetic layer 2. Particularly, it is known that a large output is obtained when a material having a composition of Co—Fe—B is generated according to sputter as a material of the magnetization fixed layer 1 and the magnetic coupling layer.

In addition, the thickness of the portion of the magnetic wall driving layer 3 which is superposed on the magnetization fixed layer 1 may be greater than the thickness of other portions in plan view. When the magnetic wall DW is shifted under the non-magnetic layer 2, the cross section of the magnetic wall DW increases to reduce the current density, decreasing the moving speed of the magnetic wall DW. When the moving speed of the magnetic wall DW decreases, the composition ratio of the first region 3a in the portion of the magnetic wall driving layer 3 which comes into contact with the magnetization fixed layer 1 and the second region 3b is easily controlled and output data is easily read as an analog value.

Such a structure can be manufactured by forming the magnetic wall driving layer 3, the non-magnetic layer 2 and the magnetization fixed layer 1 through continuous film deposition and eliminating unnecessary portions. When continuous film deposition is performed, layers to be coupled are strongly coupled and thus magnetic coupling and output with higher efficiency are obtained.

In addition, the same configuration as that used for a magnetoresistive effect device can be used.

For example, each layer may be composed of a plurality of layers and another layer such as an antiferromagnetic layer for fixing the magnetization direction of the magnetization fixed layer 1 may be included.

Writing Operation

Figure 3:
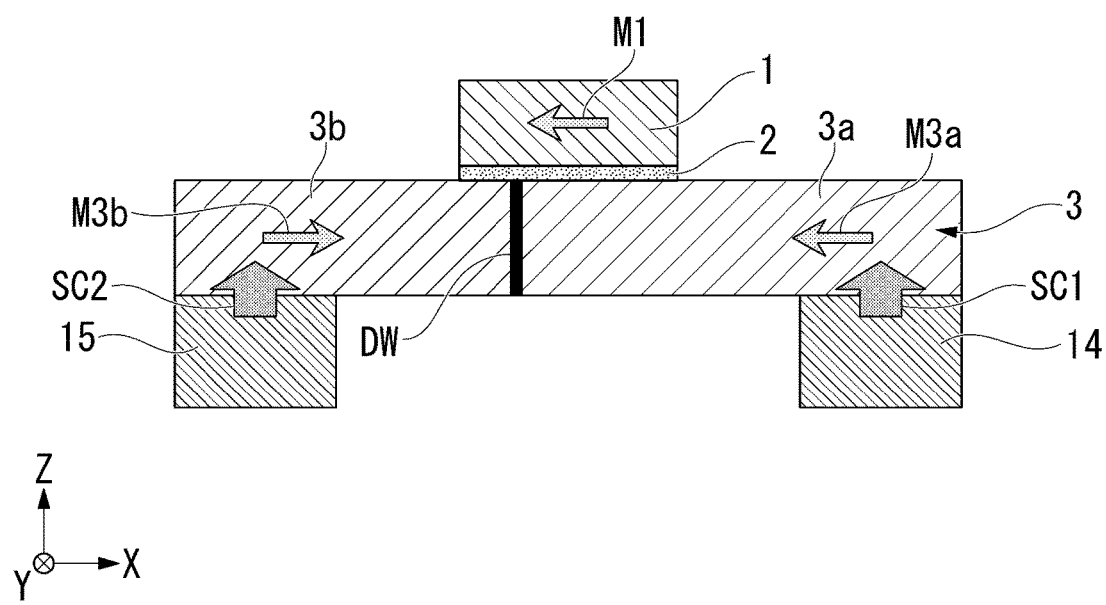
FIG. 3 is a schematic cross-sectional view of the magnetic wall utilization type analog memory device according to the first embodiment of the present invention shown in FIG. 2.

FIG. 3 is a schematic cross-sectional view of the magnetic wall utilization type analog memory device according to the first embodiment of the present invention shown in FIG. 2.

When a writing operation is performed in the magnetic wall utilization type analog memory device 101 according to the first embodiment of the present invention, a pure spin current generated according to spin Hall effect by flowing currents $I_{14}$ and $I_{15}$ through at least one of the first spin-orbit torque wiring 14 and the second spin-orbit torque wiring 15 and a pure spin current generated due to spin accumulation (a state in which one of upward spin or downward spin is present in a larger amount) generated according to interface Rashba effect at the interface between the spin-orbit torque wiring and the magnetic wall driving layer 3 are used.

A spin Hall effect is a phenomenon that a pure spin current is induced in a direction perpendicular to a direction of current on the basis of a spin orbital interaction when the current flows through a material. When a current flows in the extending direction of the spin-orbit torque wiring, a first spin oriented in one direction and a second spin oriented in a reverse direction are bent in a direction perpendicular to the current. The general Hall effect and the spin Hall effect are common in that moving (shifting) charges (electrons) bend moving (shifting) directions but are considerably different from each other in that charged particles moving in a magnetic field receive Lorentz force to bend the moving direction in the general Hall effect whereas electrons simply move (a current simply flows) to bend the moving direction although a magnetic field is not present in the spin Hall effect.

The number of electrons of the first spin is the same as the number of electrons of the second spin in non-magnetic materials (materials other than ferromagnetic materials). Accordingly, the number of electrons of the first spin directed in the upward direction is the same as the number of electrons of the second spin directed in the downward direction in the figure, for example. When the flow of electrons of the first spin is represented as $J_\uparrow$, the flow of electrons of the second spin is represented as $J_\downarrow$, and a spin current is represented as $J_S$, $J_s=J_\uparrow-J_\downarrow$ is defined. $J_S$ is an electron flow of polarizability of 100%. That is, a current as a net flux of charges is zero in the spin-orbit torque wiring, and a spin current unaccompanied with this current is particularly called a pure spin current.

When the spin-orbit torque wiring in which the pure spin current is generated is bonded to the magnetic wall driving layer 3, spins oriented in a predetermined direction spread and flow into the magnetic wall driving layer 3.

Although the detailed mechanism of the interface Rashba effect is not apparent, it is conceived as follows. At the interface between different materials, space inversion symmetry is broken and thus presence of a potential gradient in a surface-perpendicular direction is considered. When a current flows through such an interface at which the potential gradient is present in the surface-perpendicular direction, that is, when electrons move in a two-dimensional plane, an effective magnetic field acts on spins in the in-plane direction perpendicular to the moving direction of the electrons and thus the direction of the spins is aligned with the direction of the effective magnetic field. Accordingly, spin accumulation is formed at the interface. Then, this spin accumulation causes a spin current spreading out of plane to be generated.

For example, in FIG. 2, the interface between the spin-orbit torque wiring and the magnetic wall driving layer 3 corresponds to the interface between different materials. Accordingly, spins oriented in a predetermined direction are accumulated in the surface of the spin-orbit torque wiring at the side of the magnetic wall driving layer 3. The accumulated spins spread and flow into the magnetic wall driving layer 3 in order to obtain energy stabilization.

The direction of spins spreading and flowing into the magnetic wall driving layer 3 can be changed with the direction of current flowing through the first spin-orbit torque wiring 14 and the second spin-orbit torque wiring 15. Spins in the same direction as that of magnetization $M_{3a}$ are supplied to the first region 3a of the magnetic wall driving layer 3 and spins in the same direction as that of magnetization $M_{3b}$ are supplied to the second region 3b of the magnetic wall driving layer 3.

In this manner, spins in a predetermined direction can be supplied to the magnetic wall driving layer 3 by flowing currents $I_{14}$ and $I_{15}$ through at least one of the first spin-orbit torque wiring 14 and the second spin-orbit torque wiring 15 and consequently the position of the magnetic wall in the magnetic wall driving layer 3 can be shifted.

Figure 4A:
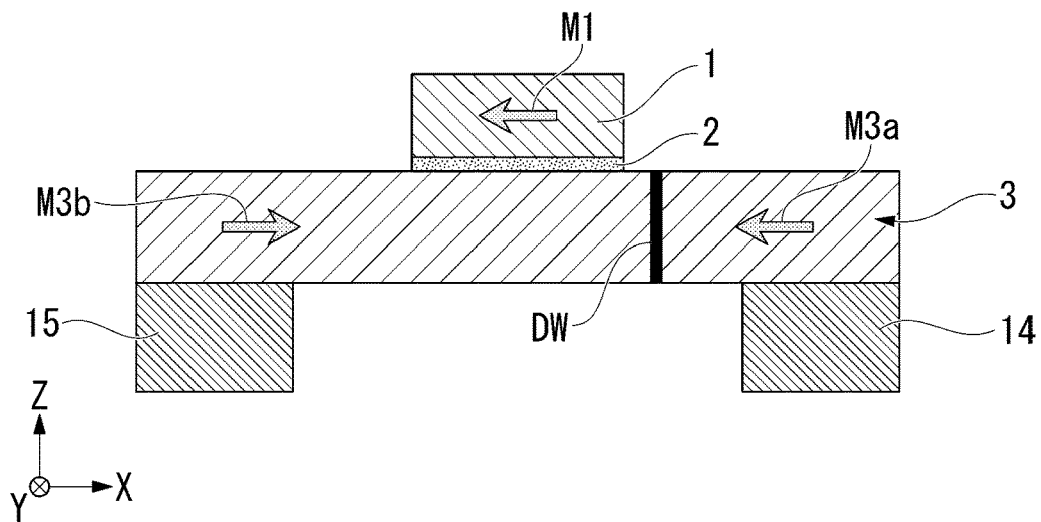
FIG. 4A is a schematic cross-sectional view schematically showing a position of a magnetic wall in a magnetic wall driving layer, which shows an example of a position of the magnetic wall when the magnetic wall is not present directly under a magnetization fixed layer and the whole portion directly under the magnetization fixed layer is antiparallel to the magnetization direction of the magnetization fixed layer.

FIG. 4A shows a state in which the position of the magnetic wall has been shifted to a different position from the position shown in FIG. 3.

Figure 4B:
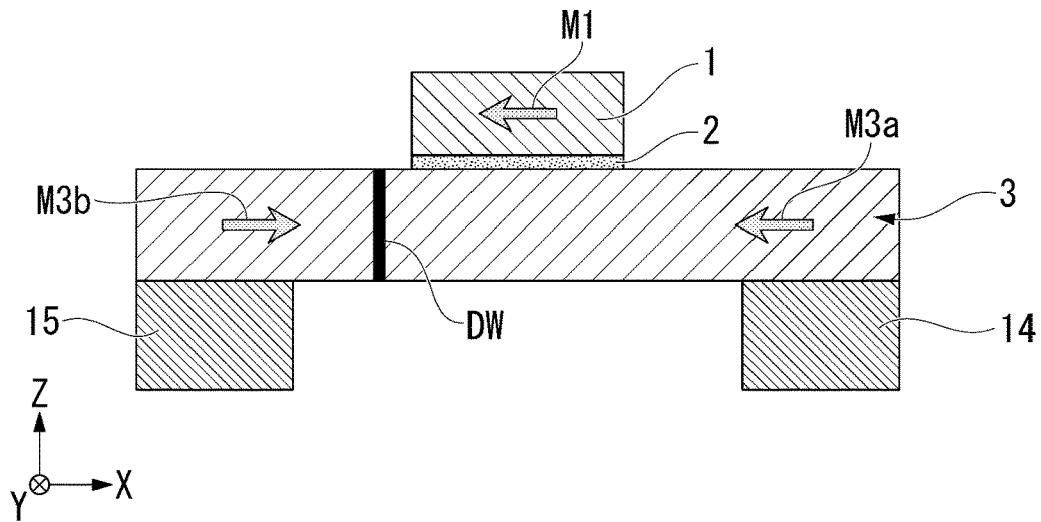
FIG. 4B is a schematic cross-sectional view schematically showing a position of the magnetic wall in the magnetic wall driving layer, which shows an example of a position of the magnetic wall when the magnetic wall is not present directly under the magnetization fixed layer and the whole portion directly under the magnetization fixed layer is parallel to the magnetization direction of the magnetization fixed layer.
Figure 4C:
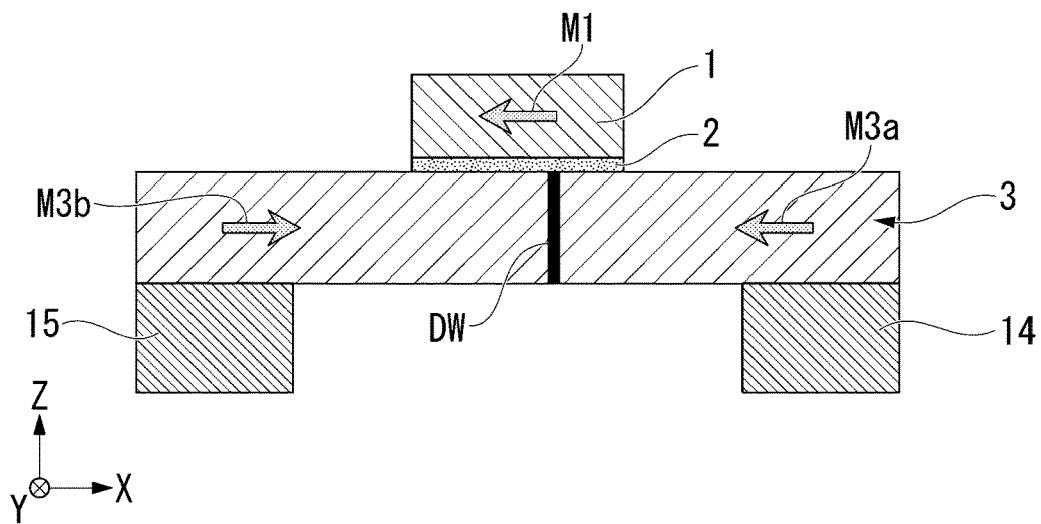
FIG. 4C is a schematic cross-sectional view schematically showing a position of the magnetic wall in the magnetic wall driving layer, which shows an example when the magnetic wall is present directly under the magnetization fixed layer.

When the position of the magnetic wall DW is changed, the magnetization state of the portion of the magnetic wall driving layer 3 which comes into contact with the magnetization fixed layer 1 is changed. For example, data can be recorded as 2 values by setting a state in which the magnetization state of the portion of the magnetic wall driving layer 3 which comes into contact with the magnetization fixed layer 1 is antiparallel to magnetization M1 of the magnetization fixed layer 1, as shown in FIG. 4A, to "0" and setting a state in which the magnetization state of the portion of the magnetic wall driving layer 3 which comes into contact with the magnetization fixed layer 1 is parallel to magnetization M1 of the magnetization fixed layer 1, as shown in FIG. 4B, to "1." In addition, when the magnetic wall DW is present in the portion of the magnetic wall driving layer 3 which comes into contact with the magnetization fixed layer 1, as shown in FIG. 4C, the composition ratio of magnetization M3a and magnetization M3b in the magnetic wall driving layer 3 changes. Data can be recorded as multiple values by providing a plurality of threshold values of a varying resistance value.

In addition, a shift amount (shifting distance) of the magnetic wall DW can be controlled to be variable by adjusting the amounts of the writing currents $I_{14}$ and $I_{15}$ and time. For example, a shift amount (shifting distance) of the magnetic wall DW may be set by the number of pulses or a pulse width with respect to the amounts of the writing currents and time.

In the magnetic wall utilization type analog memory device of the present invention, at least one of the first magnetization supplying part 4 and the second magnetization supplying part 5 is not a magnetization supply layer (refer to the first magnetization supply layer 114 and the second magnetization supply layer 115 of FIG. 13) in which magnetization has been fixed. Among two edges of the magnetic wall driving layer 3 having the magnetization fixed layer 1 interposed therebetween, at the edge to which the magnetization supply layer in which magnetization has been fixed is not bonded, the magnetic wall may reach the bridge of the magnetic wall driving layer 3 to form a single magnetic domain. In this case, it is possible to introduce the magnetic wall into the magnetic wall driving layer using a magnetization supplying part and then shift the magnetic wall under the magnetization fixed layer 1 to write when writing is performed.

When both the first magnetization supplying part 4 and the second magnetization supplying part 5 are not magnetization supply layers in which magnetization has been fixed, for example, in the case of the first embodiment, it is possible to introduce the magnetic wall by flowing currents to the first spin-orbit torque wiring 14 and the second spin-orbit torque wiring 15 in opposite directions to introduce magnetizations antiparallel to each other. The same applies to other embodiments in which the magnetic wall can be introduced by respectively introducing magnetizations antiparallel to each other from the first magnetization supplying part 4 and the second magnetization supplying part 5.

Reading Operation

Figure 5:
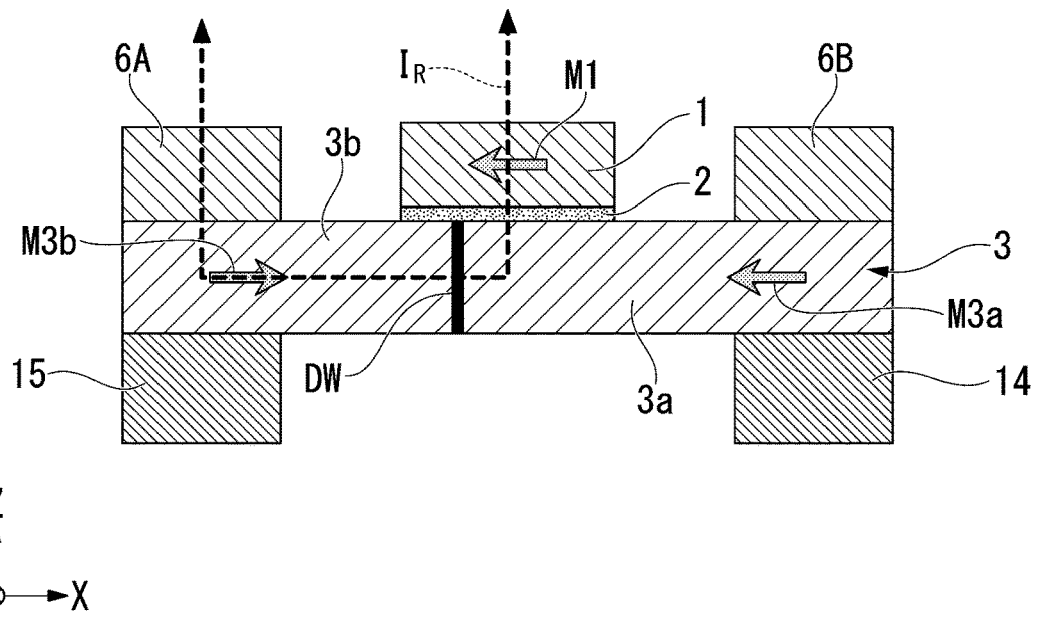
FIG. 5 is a diagram showing a reading operation of the magnetic wall utilization type analog memory device according to the first embodiment.

Next, a data reading operation will be described. FIG. 5 is a diagram showing a reading operation of the magnetic wall utilization type analog memory device 101 according to the present embodiment.

As shown in FIG. 5, when data is read, it is desirable to flow a reading current in a direction in which magnetization M3b is present which is reverse to the orientation direction of magnetization M1 of the magnetization fixed layer 1. That is, it is more desirable to flow the reading current through the magnetization fixed layer 1, the second region 3b of the magnetic wall driving layer 3 and the electrode 6A rather than flowing the reading current through the magnetization fixed layer 1, the second region 3b of the magnetic wall driving layer 3 and the electrode 6B. The flow direction of current $I_R$ is controlled by a current controlling part. By flowing the current $I_R$ in a direction in which magnetization M3b in the orientation direction reversed with respect to that of magnetization M1 of the magnetization fixed layer 1 is present, resistance value changes in the magnetic wall utilization type analog memory device 101 become linear and thus data can be read as multiple values more accurately. The reason for this will be described below.

Magnetization M3$a$ of the first region 3$a$ of the magnetic wall driving layer 3 is oriented parallel to magnetization M1 of the first magnetization fixed layer 1. On the other hand, magnetization M3$b$ of the second region 3$b$ of the magnetic wall driving layer 3 is oriented antiparallel to magnetization M1 of the first magnetization fixed layer 1. That is, the interface between the magnetization fixed layer 1 and the first region 3$a$ has a low resistance and the interface between the magnetization fixed layer 1 and the second region 3$b$ has a high resistance.

Figure 6A:
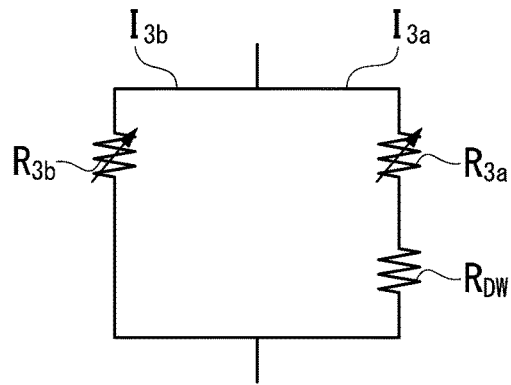
FIG. 6A is a diagram schematically showing a part of a circuit when data is read and a circuit diagram when a reading current flows in a direction in which magnetization oriented in a direction reversed with respect to magnetization of a magnetization fixed layer is present as in the magnetic wall utilization type analog memory device according to the present embodiment.
Figure 6B:
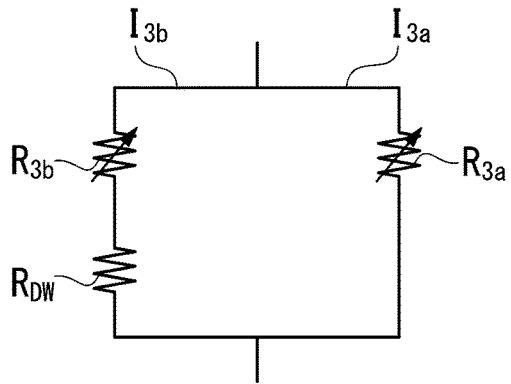
FIG. 6B is a diagram schematically showing a part of a circuit when data is read and a circuit diagram when the reading current flows in a direction in which magnetization oriented in the same direction as magnetization of the magnetization fixed layer is present.

FIG. 6A and FIG. 6B are diagrams schematically showing a part of a circuit when data is read in order to conceptually show the above reason, FIG. 6A is a circuit diagram when the reading current $I_R$ flows in a direction in which magnetization M3$b$ in an orientation direction reversed with respect to that of magnetization M1 of the magnetization fixed layer 1 is present as in the magnetic wall utilization type analog memory device according to the present embodiment (dotted line in FIG. 5) and FIG. 6B is a circuit diagram when the reading current flows in a direction in which magnetization M3$a$ in the same orientation direction at that of magnetization M1 of the magnetization fixed layer 1 is present.

When the reading current $I_R$ flows to the side of the second region 3$b$ in which magnetization M3$b$ in an orientation direction reversed with respect to that of magnetization M1 of the magnetization fixed layer 1 is present, a parallel circuit having a current path $I_{3a}$ having a resistance $R_{3a}$ at the interface between the magnetization fixed layer 1 and the first region 3$a$ and a current path $I_{3b}$ having a resistance $R_{3b}$ at the interface between the magnetization fixed layer 1 and the second region 3$b$ is formed, as shown in FIG. 4A. The resistance $R_{3a}$ at the interface between the magnetization fixed layer 1 and the first region 3$a$ and the resistance $R_{3b}$ at the interface between the magnetization fixed layer 1 and the second region 3$b$ are regarded as variable resistances that vary according to the position of the magnetic wall DW in the magnetic wall driving layer 3 in contact with the magnetization fixed layer 1.

In addition, since the reading current $I_R$ is finally directed to the side of the second region 3$b$, the current flowing through the interface between the magnetization fixed layer 1 and the first region 3$a$ necessarily passes through the magnetic wall DW between the first region 3$a$ and the second region 3$b$. That is, a resistance $R_{DW}$ at the interface of the magnetic wall DW is superimposed on the current path $I_{3a}$. Since the resistive state of the magnetic wall DW does not considerably change only by a change in the position of the magnetic wall DW, the resistance $R_{DW}$ is regarded as a fixed resistance.

On the other hand, when the reading current flows to the side of the first region 3$a$ in which magnetization M3$a$ in the same orientation direction at that of magnetization M1 of the magnetization fixed layer 1 is present, a parallel circuit having a current path $I_{3a}$ having a resistance $R_{3a}$ at the interface between the magnetization fixed layer 1 and the first region 3$a$ and a current path $I_{3b}$ having a resistance $R_{3b}$ at the interface between the magnetization fixed layer 1 and the second region 3$b$ is formed, as shown in FIG. 4B. On the other hand, since the reading current is finally directed to the side of the first region 3$a$, current flowing through the interface between the magnetization fixed layer 1 and the second region 3$b$ needs to pass through the magnetic wall DW between the first region 3$a$ and the second region 3$b$. That is, a resistance $R_{DW}$ at the interface of the magnetic wall DW is superimposed on the current path $I_{3b}$.

Here, the resistance $R_{3a}$ at the interface between the magnetization fixed layer 1 and the first region 3$a$ is lower than the resistance $R_{3b}$ at the interface between the magnetization fixed layer 1 and the second region 3$b$, as described above. As shown in FIG. 4B, when the current path $I_{3b}$ having the resistance $R_{3b}$ higher than the resistance $R_{DW}$ at the interface of the magnetic wall DW is present, the total resistance of the current path $I_{3b}$ increases and thus a large amount of the reading current flows through the current path $I_{3a}$. Accordingly, when the reading current $I_R$ flows to the side of the first region 3$a$ in which magnetization M3$a$ in the same orientation direction as that of magnetization M1 of the magnetization fixed layer 1 is present, a mainly read resistance value change in the magnetic wall utilization type analog memory device 100 is a resistance value change in the resistance $R_{3a}$ at the interface between the magnetization fixed layer 1 and the first region 3$a$, and a resistance value change in the resistance $R_{3b}$ at the interface between the magnetization fixed layer 1 and the second region 3$b$ does not greatly contribute.

On the other hand, when the resistance $R_{DW}$ at the interface of the magnetic wall DW is present on the current path $I_{3a}$ having the resistance $R_{3a}$ that is a low resistance, as shown in FIG. 4A, the total resistance of the current path $I_{3a}$ increases and thus a distribution ratio of the reading current flowing through the current path $I_{3a}$ and the reading current flowing through the current path $I_{3b}$ is averaged. Accordingly, when the reading current $I_R$ flows to the side of the second region 3$b$ in which magnetization M3$b$ in an orientation direction reversed with respect to that of magnetization M1 of the magnetization fixed layer 1 is present, the reading current flow through both the current path $I_{3a}$ and the current path $I_{3b}$ and superposition of a resistance value change in the resistance $R_{3a}$ between the magnetization fixed layer 1 and the first region 3$a$ and a resistance value change in the resistance $R_{3b}$ between the magnetization fixed layer 1 and the second region 3$b$ is read as a resistance value change in the magnetic wall utilization type analog memory device 100.

In this manner, it is possible to read resistance value changes in the two resistances $R_{3a}$ and $R_{3b}$ (variable resistances) on the circuit as resistance value changes in the magnetic wall utilization type analog memory device 100 by controlling the flow direction of the current $I_R$ during readout by a current controlling part to read data more accurately.

Meanwhile, some of the current $I_R$ flow in a direction (X direction) penetrating the magnetic wall DW during readout.

Here, although the magnetic wall DW is shifted and thus a writing state change during readout is also conceived, the current $I_R$ applied during readout is less than currents $I_{W1}$ and $I_{W2}$ applied during writing. Accordingly, shifting of the magnetic wall DW can be prevented by adjusting the current $I_R$ applied during readout.

As described above, the magnetic wall utilization type analog memory device 100 according to the first embodiment can record data as multiple values by adjusting the composition ratio of the first region 3$a$ and the second region 3$b$ in portions of the magnetic wall driving layer 3 which come into contact with the magnetization fixed layer 1 during writing and shifting the magnetic wall DW. In addition, the flow direction of the current $I_R$ during readout can be controlled by a current controlling part such that resistance value changes in the magnetic wall utilization type analog memory device 100 linearly vary according to driving of the magnetic wall, thereby measuring analog values more accurately.

The current controlling part is a controlling part that controls a current to flow from the magnetization fixed layer 1 to the side of the second region 3b of the magnetic wall driving layer 3 during readout.

Patent Document 4 discloses only reading of data according to resistance value changes in a magnetoresistive effect device and does not disclose how to apply a reading current. Accordingly, there were cases in which resistance value changes according to a magnetization state (the position of a magnetic wall) were not linear and information written in a multi-valued manner could not be stably read. However, information written as a multi-valued manner can be stably read according to this current controlling part.

There is a potential controlling part that adjusts the potentials of the magnetization fixed layer 1, the first region 3a and the second region 3b during readout as a current controlling part. For example, the magnetization fixed layer 1 and the first region 3a are set to an equal potential and the potential of the second region 3b is set to be lower than the potential of the magnetization fixed layer 1. When the potentials are set in this manner, a current flows from the magnetization fixed layer 1 to the second region 3b during readout.

In addition, a rectifying device such as a diode may be used as a current controlling part. A current may be controlled to flow from the magnetization fixed layer 1 to the second region 3b during readout using a diode or the like.

Second Embodiment

Figure 7:
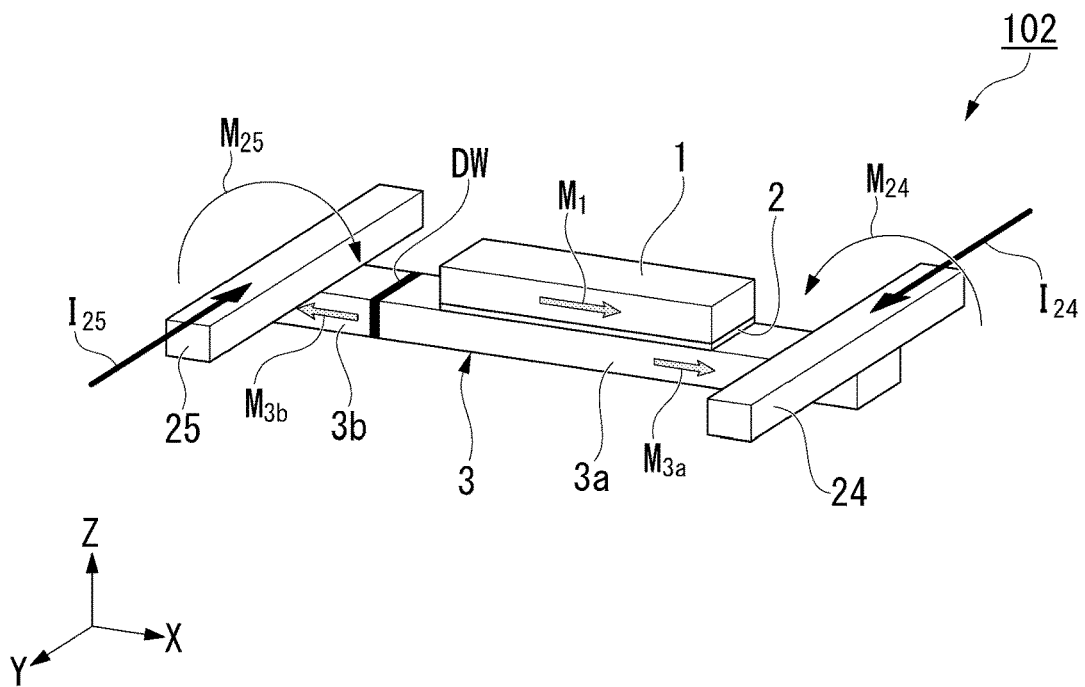
FIG. 7 is a schematic perspective view of an example of a magnetic wall utilization type analog memory device according to a second embodiment.

FIG. 7 is a schematic perspective view of a magnetic wall utilization type analog memory device 102 according to a second embodiment. The magnetic wall utilization type analog memory device 102 according to the second embodiment differs from the magnetic wall utilization type analog memory device 101 according to the first embodiment in that magnetization supplying part are different. Other components are the same as those of the magnetic wall utilization type analog memory device 101 according to the first embodiment and the same signs are affixed to the same components.

In the magnetic wall utilization type analog memory device 102 according to the second embodiment, magnetization supplying part are a first magnetic field application wiring 24 and a second magnetic field application wiring 25 that are electrically insulated from the magnetic wall driving layer 3 and extend in a direction intersecting the magnetic wall driving layer 3.

Since the magnetic wall utilization type analog memory device 102 according to the second embodiment has different magnetization supplying part, the writing operation is different. When writing is performed in the magnetic wall utilization type analog memory device 101, currents $I_{24}$ and $I_{25}$ flow through at least one of the first magnetic field application wiring 24 and the second magnetic field application wiring 25. When the currents $I_{24}$ and $I_{25}$ flow through the first magnetic field application wiring 24 and the second magnetic field application wiring 25, magnetic fields $M_{24}$ and $M_{25}$ are generated according to Ampere's law.

The directions of the current $I_{24}$ flowing through the first magnetic field application wiring 24 and the current $I_{25}$ flowing through the second magnetic field application wiring 25 are reverse to each other. Since the directions of the currents are reverse to each other, the directions of the magnetic fields $M_{24}$ and $M_{25}$ generated around the wirings are reverse to each other. The magnetic field $M_{24}$ created by the first magnetic field application wiring 24 provides +X magnetic field $M_{24}$ to the magnetic wall driving layer 3 and the magnetic field $M_{15}$ created by the second magnetic field application wiring 25 provides −X magnetic field $M_{25}$ to the magnetic wall driving layer 3. That is, the currents flow through the first magnetic field application wiring 24 and the second magnetic field application wiring 25 to change the composition ratio of the first region 3a and the second region 3b of the magnetic wall driving layer 3 and thus the position of the magnetic wall DW can be caused to be shifted and data can be recorded as multiple values.

During data readout, data can be accurately read by controlling a current flow direction between the magnetization fixed layer 1 and the second region 3b of the magnetic wall driving layer 3 as in the magnetic wall utilization type analog memory device 101 according to the first embodiment.

Any material can be used for the first magnetic field application wiring 24 and the second magnetic field application wiring 25 if it has high conductivity. For example, gold, silver, copper, aluminum and the like can be used.

Figure 8:
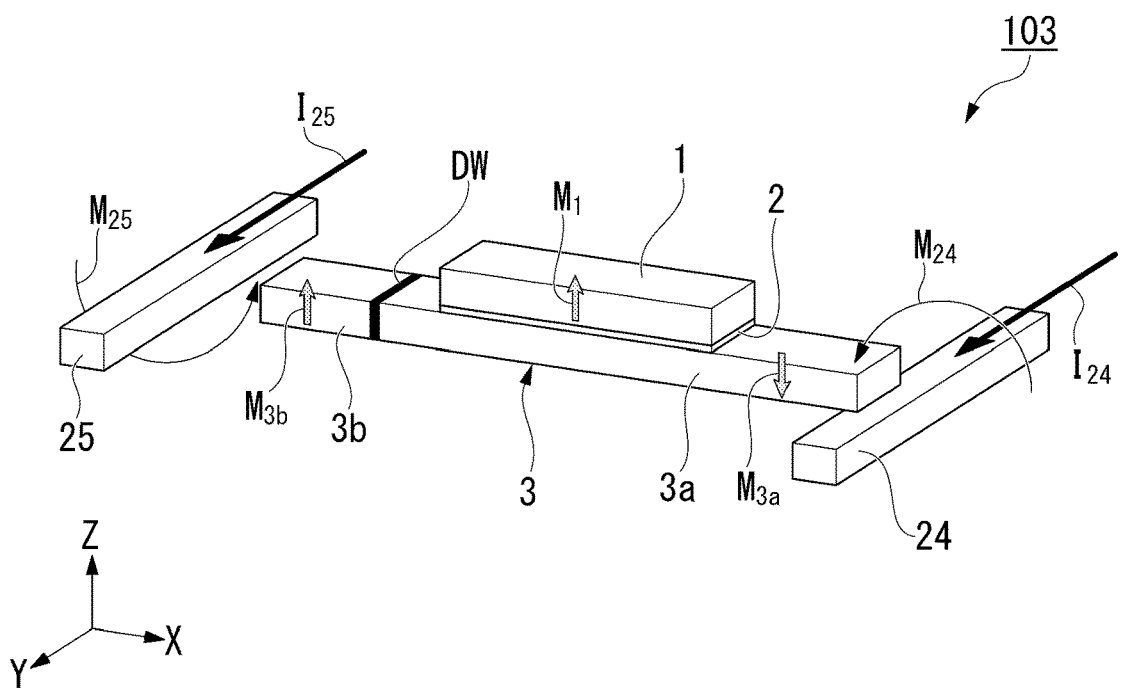
FIG. 8 is a schematic perspective view of another example of the magnetic wall utilization type analog memory device according to the second embodiment.

In addition, when the direction of magnetization of the magnetization fixed layer 1 and the magnetic wall driving layer 3 is oriented in the Z direction as in a magnetic wall utilization type analog memory device 103 shown in FIG. 8, the position of the magnetic wall DW can be shifted by adjusting the positional relationship between the first magnetic field application wiring 24 and the second magnetic field application wiring 25 and directions in which the currents $I_{24}$ and $I_{25}$ flow.

Third Embodiment

Figure 9:
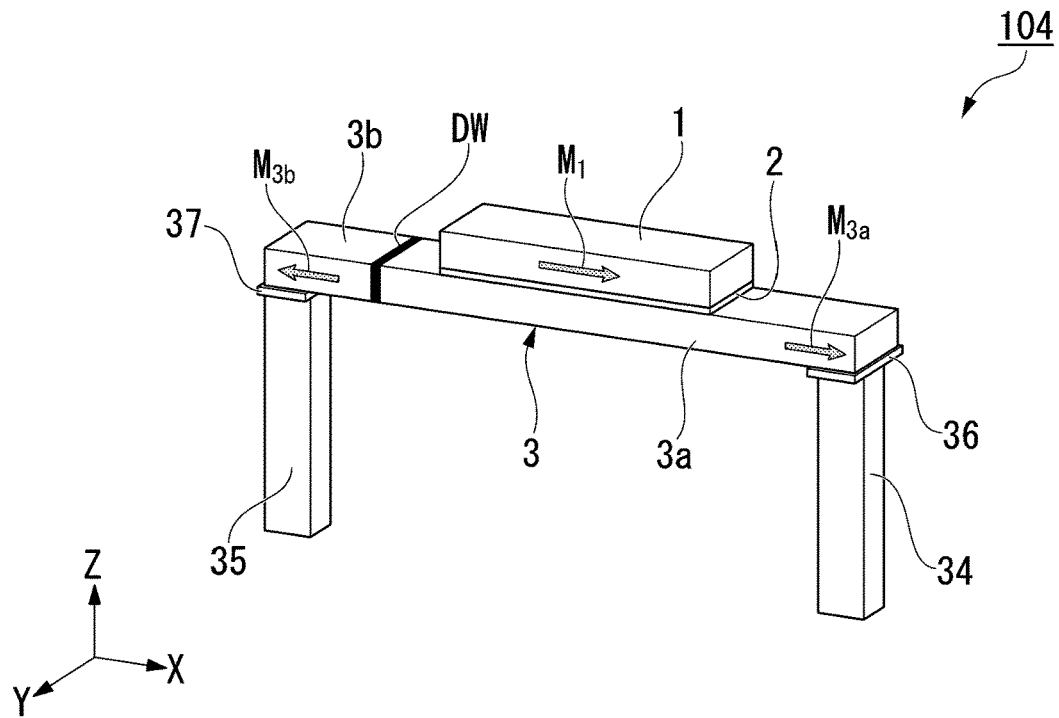
FIG. 9 is a schematic perspective view of an example of a magnetic wall utilization type analog memory device according to a third embodiment.

FIG. 9 is a schematic perspective view of a magnetic wall utilization type analog memory device 104 according to a third embodiment. The magnetic wall utilization type analog memory device 104 according to the third embodiment differs from the magnetic wall utilization type analog memory device 101 according to the first embodiment in that magnetization supplying part are different. Other components are the same as those of the magnetic wall utilization type analog memory device 101 according to the first embodiment and the same signs are affixed to the same components.

In the magnetic wall utilization type analog memory device 104 according to the third embodiment, magnetization supplying part are a first voltage application terminal 34 and a second voltage application terminal 35 connected to the magnetic wall driving layer 3 through insulating layers 36 and 37. Hereinafter, the first voltage application terminal 34 and the second voltage application terminal 35 may be collectively called a voltage applying part.

Since the magnetic wall utilization type analog memory device 104 according to the third embodiment has different magnetization supplying part, the writing operation is different. When writing is performed in the magnetic wall utilization type analog memory device 104, a voltage is applied between the magnetization fixed layer 1 and the first voltage application terminal 34 or the second voltage application terminal 35.

For example, when a voltage is applied between the magnetization fixed layer 1 and the first voltage application terminal 34, a part of magnetization $M_{3a}$ of the first region 3a is affected by the voltage. When the voltage is applied in the form of a pulse, a part of magnetization $M_{3a}$ is oriented in the Z direction when the voltage is applied and oriented in +X direction or −X direction which is an easy magnetization direction at the timing when voltage application is stopped. Whether the magnetization oriented in the Z direction collapses in the +X direction or the −X direction is equal probability, and a part of magnetization $M_{3a}$ can be oriented from the +X direction to the −X direction by adjusting a timing, the number of times and a period at which a pulse voltage is applied.

In this manner, it is possible to supply spins to the magnetic wall driving layer 3 in a predetermined direction by applying a pulse voltage to the magnetic wall driving layer 3. As a result, the composition ratio of the first region 3a and the second region 3b of the magnetic wall driving layer 3 changes and the position of the magnetic wall DW is shifted and thus data can be recorded as multiple values.

Figure 10:
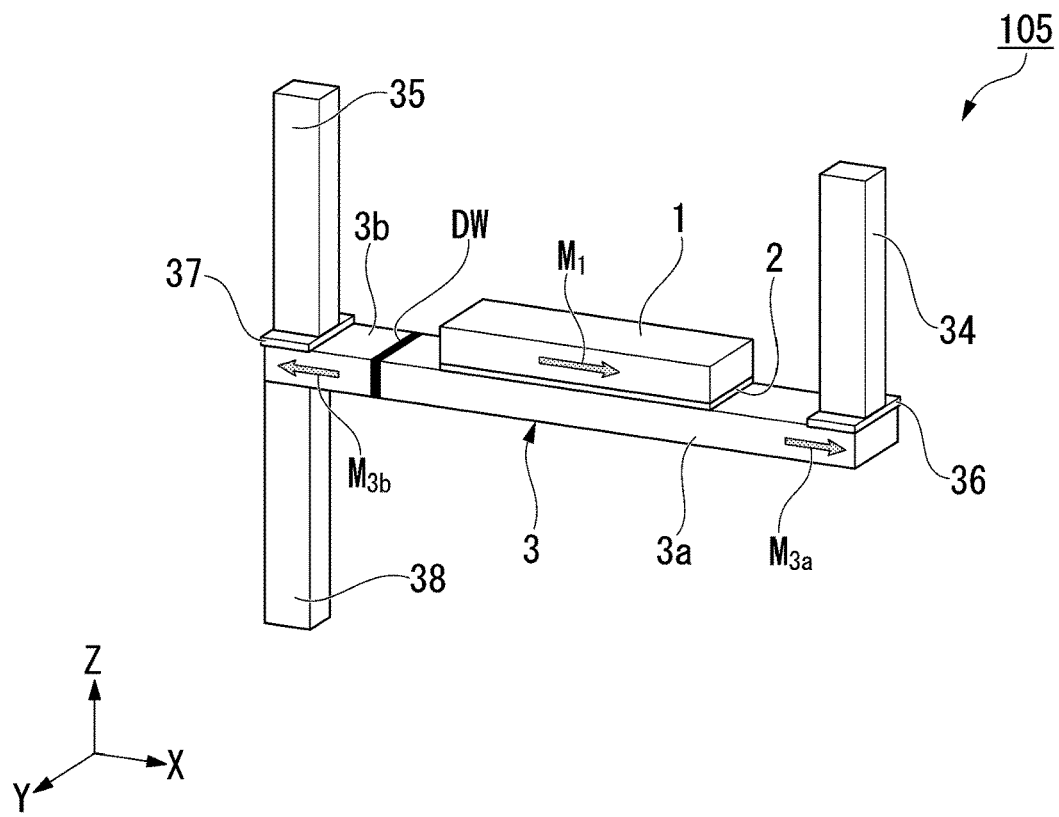
FIG. 10 is a schematic perspective view of another example of the magnetic wall utilization type analog memory device according to the third embodiment.

Meanwhile, the insulating layers 36 and 37 hinder current flow during readout. Accordingly, presence of the insulating layers 36 and 37 may decrease output characteristics of the magnetic wall utilization type analog memory device 104. In this case, a wiring 38 for readout through which a reading current flows may be provided as in a magnetic wall utilization type analog memory device 105 shown in FIG. 10.

Although embodiments of the present invention have been described in detail with reference to the drawings, components and combinations thereof in each embodiment are examples and addition, omission, substitution and other modifications of components can be made without departing from the scope of the present invention.

With respect to the magnetization supplying part, the means for supplying magnetization to the first region 3a may differ from the means for supply magnetization to the second region 3b. For example, the means for supplying magnetization to the first region 3a may be the first spin-orbit torque wiring 14 and the means for supply magnetization to the second region 3b may be the second magnetic field application wiring 25. In this manner, the magnetization supplying part according to the first to third embodiments may be combined and arranged. In addition, the writing current flowing through the magnetic wall driving layer 3 may be used as a spin-polarized current as a magnetization supplying part.

(Magnetic Wall Utilization Type Analog Memory)

A magnetic wall utilization type analog memory according to the present embodiment includes a plurality of magnetic wall utilization type analog memory devices according to the above-described embodiments. The plurality of magnetic wall utilization type analog memory devices may be arranged in an array.

(Nonvolatile Logic Circuit)

A nonvolatile logic circuit according to the present embodiment has magnetic wall utilization type analog memory devices according to the present embodiment which are arranged in an array, includes an STT-MRAM inside or outside the array, has a storage function and a logic function and includes the magnetic wall utilization type analog memory devices and the STT-MRAM as the storage function.

Since the magnetic wall utilization type analog memory devices and the STT-MRAM can be manufactured through the same process, costs can be decreased. In addition, since the digital STT-MRAM and the magnetic wall utilization type analog memory devices arranged in an array are provided in the same circuit, it is possible to form a logic which can perform input/output in a digital manner and perform internal processing in an analog manner.

(Magnetic Neuro Device)

Figure 11:
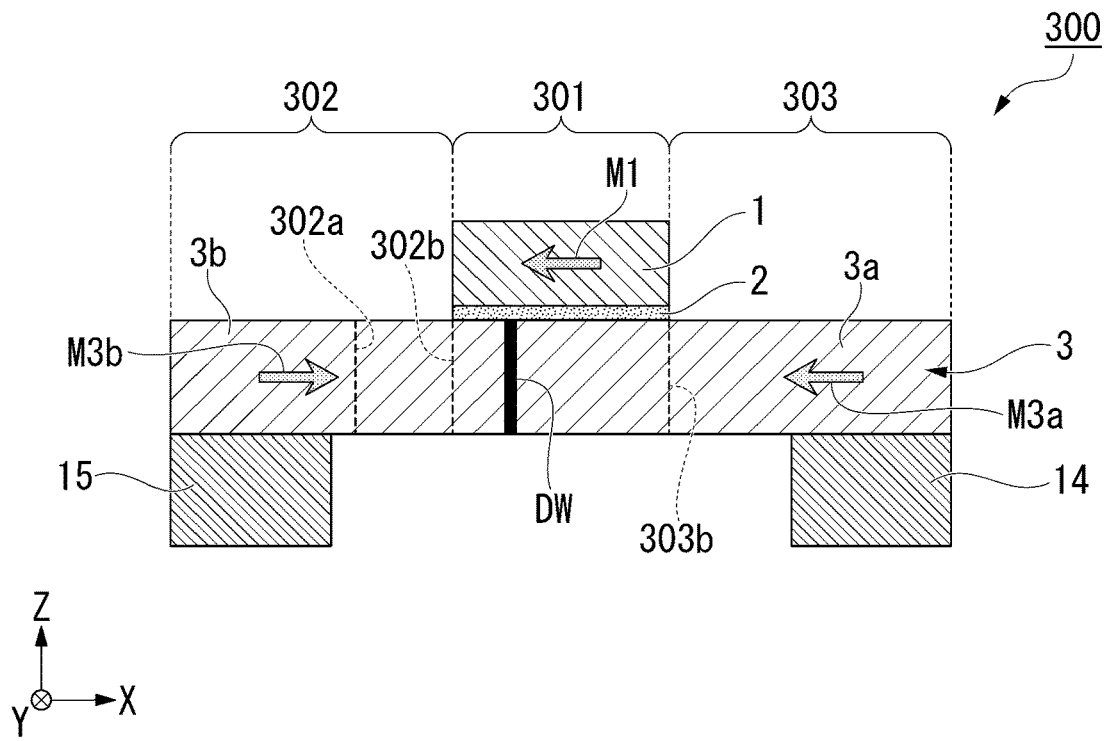
FIG. 11 is a schematic cross-sectional view of an example of a magnetic neuro device according to the present invention.

FIG. 11 is a schematic cross-sectional view of an example of a magnetic neuro device according to the present embodiment. The magnetic neuro device 300 according to the present embodiment includes the above-described magnetic wall utilization type analog memory device and a current source (not shown) having a control circuit. A first storage part 301, and a second storage part 302 and a third storage part 303 having the first storage part 301 interposed therebetween are present in the longitudinal direction of the magnetic wall driving layer 3 of the magnetic wall utilization type analog memory device. The control circuit flows a writing current capable of sequentially shifting the magnetic wall such that the magnetic wall stops at least once in all of the first storage part 301, the second storage part 302 and the third storage part 303.

The first storage part 301 is a part of the magnetic wall driving layer 3 which is superimposed on the magnetization fixed layer 1 in plan view. Both the second storage part 302 and the third storage part 303 are parts that are not superimposed on the magnetization fixed layer 1 in plan view, the former is a part at the side of the second spin-orbit torque wiring 15 and the latter is a part at the side of the first spin-orbit torque wiring 14.

The magnetic neuro device is a device that simulates a synapse operation, and it is possible to use the magnetic wall utilization type analog memory device according to the present embodiment as a magnetic neuro device by providing a control circuit therein.

A synapse has a linear output for an external stimulus and reversibly outputs the output without a hysteresis when a reverse load is applied thereto. When the area of the part in which the magnetization directions of the magnetization fixed layer 1 and the magnetic wall driving layer 3 are parallel to each other continuously changes according to driving (shifting) of the magnetic wall DW, a parallel circuit according to a current path formed in the part in which the magnetization directions of the magnetization fixed layer 1 and the magnetic wall driving layer 3 are parallel to each other and a current path formed in the part in which the magnetization directions of the magnetization fixed layer 1 and the magnetic wall driving layer 3 are antiparallel to each other is formed.

When the magnetic wall DW of the magnetic wall driving layer 3 is shifted, the ratio of the area percentage of the part in which the magnetization directions are parallel to each other to the area percentage of the part in which the magnetization directions are antiparallel to each other changes and a relatively linear resistance variation is obtained. Further, shift of the magnetic wall DW depends on the amount of current and a duration of applied current pulses. Accordingly, the amount and direction of current and a duration of applied current pulses can be regarded as external loads.

(Initial Storage Stage)

For example, the magnetic wall of the magnetic wall driving layer 3 is shifted in the −X direction first, and the magnetic wall DW is disposed at a position 302a on the side of the second storage part 302. The magnetic wall DW is shifted in the +X direction by flowing currents $I_{14}$ and $I_{15}$ through at least one of the first spin-orbit torque wiring 14 and the second spin-orbit torque wiring 15. Reading resistance does not change until the magnetic wall DW reaches an edge 302b of the magnetization fixed layer 1 on the side of the second magnetization supplying part 15 even if the magnetic wall DW is shifted. This state (a case in which the magnetic wall DW is disposed in the second storage part 302) is called an initial storage stage. Although data is not recorded in the initial storage stage, the initial storage stage is a state in which recording of data is prepared.

(Main Storage Stage)

While the magnetic wall DW passes under the magnetization fixed layer 1 (the superimposed part in plan view, the first storage part 301), resistance during readout changes. It is possible to regard flowing current through at least one of the first spin-orbit torque wiring 14 and the second spin-orbit torque wiring 15 as an external load and read a linear resistance value variation that is proportional to the load to a certain extent. This is a main storage step. That is, a case in which the magnetic wall DW is disposed in the first storage part 301 is called a main storage stage. A state in which the magnetic wall DW is positioned outside one edge of the magnetization fixed layer 1 in the X direction is defined as storage or non-storage and a state in which the magnetic wall DW is positioned outside the other edge of the magnetization fixed layer 1 is defined as non-storage or storage. When the direction of the current flowing through the magnetic wall driving layer 3 is reversed, a reverse operation is obtained.

(In-Depth Storage Stage)

When the magnetic wall DW reaches the edge 303b of the magnetization fixed layer 1 on the side of the first magnetization supplying part 4 and the magnetic wall DW is shifted in a direction away from the magnetization fixed layer 1, a readout output does not change. However, after the magnetic wall DW is sufficiently separated from the magnetization fixed layer 1, a readout output does not change until the magnetic wall DW reaches the edge 303b of the magnetization fixed layer 1 even if a reverse load is applied. That is, when the magnetic wall DW is positioned in the third storage part 303, storage is deepened instead of being lost even if an external load is applied. That is, a case in which the magnetic wall DW is disposed in the third storage part 303 is called an in-depth storage stage.

Further, when the direction of the current flowing through the first spin-orbit torque wiring 14 and/or the second spin-orbit torque wiring 15 (the direction in which the magnetic wall DW is driven) is reversed, correspondences between the initial storage stage, the main storage stage and the deeper storage stage and each storage part are reversed.

To use a magnetic wall utilization type analog memory as a magnetic neuro device that simulates a synapse operation in this manner, shift of the magnetic wall DW needs to sequentially pass through the initial storage stage, the main storage stage and the deeper storage state. Shift of the magnetic wall DW is controlled by a current source that flows the writing current. That is, the magnetic wall utilization type analog memory functions as a magnetic neuro device by including a current source (not shown) having a control circuit that controls flowing of a writing current capable of sequentially shifting the magnetic wall such that the magnetic wall stops at least once in all of the first storage part, the second storage part and the third storage part. The number of times of shifting the magnetic wall passing through each of the first storage part 301, the second storage part 302 and the third storage part 303 is determined according to conditions of the writing current.

(Storage Erasure Stage)

Storage can be erased by shifting the magnetic wall of the magnetic wall driving layer 3 to a non-storage state. In addition, it is also possible to cause the magnetic wall to be driven or to disappear by applying an external magnetic field, heat and physical distortion. Since the output of the magnetic wall utilization analog memory represents specific low resistance and high resistance values, storage and non-storage are determined according to definition. Further, when the magnetic wall is caused to be shifted or to disappear through a method other than the method of flowing a current through the magnetic wall driving layer 3, a correlation of information between a plurality of magnetic wall utilization type analog memories is lost because the operation of the magnetic wall becomes random. This is called a storage erasure stage.

(Artificial Brain Using Magnetic Neuro Device)

The magnetic neuro device according to the present embodiment is a memory that can simulate the synapse operation and pass through the initial storage stage, the main storage stage and the in-depth storage stage. That is, it is possible to simulate a brain by providing the magnetic wall utilization type analog memory on a plurality of circuits. A highly integrated brain can be formed in an arrangement in which the magnetic wall utilization type analog memories are equally arrayed in the vertical and horizontal directions like general memories.

Figure 12:
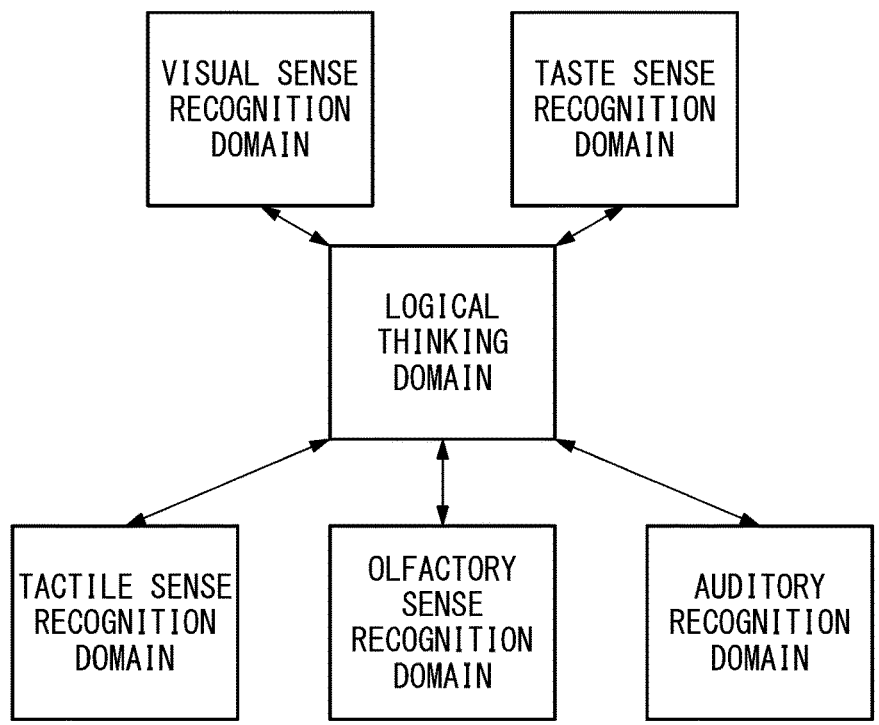
FIG. 12 is a diagram showing the concept of an artificial brain using the magnetic neuro device according to the present invention.
Figure 14:
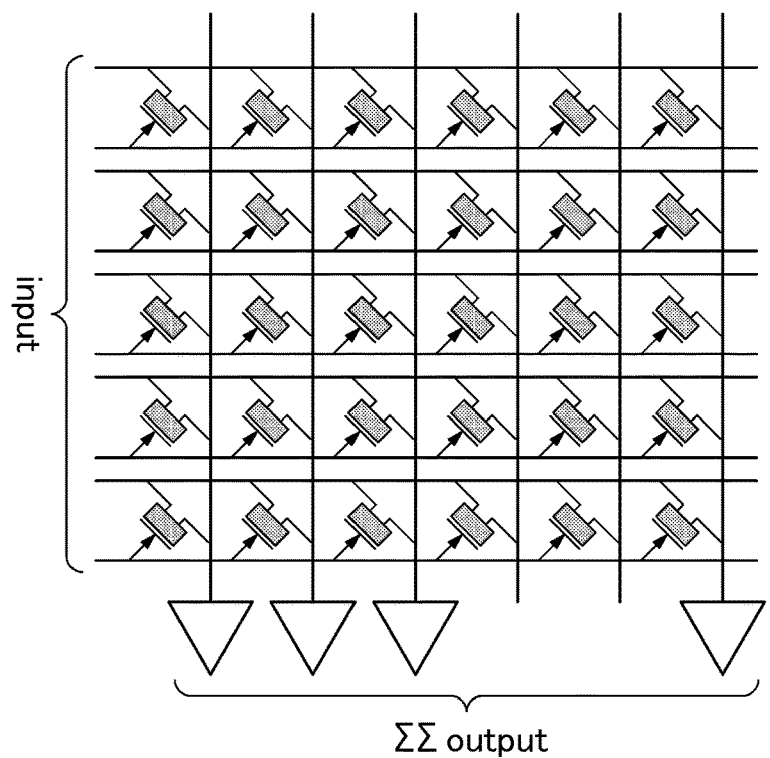
FIG. 14 is a product-sum operation circuit in which magnetic neuro devices are arranged in an array.

As shown in FIG. 12, a brain having different recognition levels with respect to external loads can be formed by setting a plurality of magnetic neuro devices having specific circuits as a block and arranging such blocks in an array. FIG. 14 is a product-sum operation circuit in which magnetic neuro devices are arranged in an array. This circuit is a circuit that receives inputs which are simultaneously input to wirings from the left in FIG. 14 and bundles and outputs output based on weights recorded by the magnetic neuro devices. For example, individuality such as a brain having high color sensitivity or a brain having high language intelligibility can be created. That is, it is possible to form a process of determining a subsequent action by recognizing information received from an external sensor in domains of five senses optimized for visual sense, taste sense, tactile sense, olfactory sense and auditory sense recognition and determining the information in a logical thinking domain. Furthermore, when the material of the magnetic wall driving layer 3 is changed, a driving speed of the magnetic wall and a magnetic wall formation method with respect to loads change, and thus an artificial brain having such changes as individuality can be formed.

INDUSTRIAL APPLICABILITY

It is possible to provide a magnetic wall utilization type analog memory device, a magnetic wall utilization type analog memory, a nonvolatile logic circuit and a magnetic neuro device which do not require at least one of the two magnetization fixed layers included in the conventional magnetic wall driving type MRAM.

REFERENCE SIGNS LIST

1 Magnetization fixed layer
2 Non-magnetic layer
3 Magnetic wall driving layer
3a First region
3b Second region
4 First magnetization supplying part
5 Second magnetization supplying part
14 First spin-orbit torque wiring
15 Second spin-orbit torque wiring
24 First magnetic field application wiring
25 Second magnetic field application wiring
34 First voltage application terminal
35 Second voltage application terminal 36, 37 Insulating layer
38 Wiring for reading
100, 101, 102, 10e, 104, 105 Magnetic wall utilization type analog memory device
300 Magnetic neuro device
301 First storage part
302 Second storage part
303 Third storage part
DW Magnetic wall

What is claimed is:

1. A magnetic wall utilization type analog memory device comprising:
    a magnetization fixed layer having a magnetization oriented in a first direction;
    a non-magnetic layer provided on one side of the magnetization fixed layer;
    a magnetic wall driving layer provided on the magnetization fixed layer with the non-magnetic layer interposed therebetween; and
    a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer,
    wherein at least one of the first magnetization supplying part and the second magnetization supplying part is a spin-orbit torque wiring which comes into contact with the magnetic wall driving layer and extends in a direction intersecting the magnetic wall driving layer.

2. The magnetic wall utilization type analog memory device according to claim 1,
    wherein the spin-orbit torque wiring is provided at the position closer to a substrate than the magnetic wall driving layer.

3. The magnetic wall utilization type analog memory device according to claim 2, further comprising a current controlling part which is configured to flow a current between the magnetization fixed layer and a region of the magnetic wall driving layer in which magnetization is oriented in the second direction reversed with respect to the first direction when reading is performed.

4. A magnetic wall utilization type analog memory comprising a plurality of magnetic wall utilization type analog memory devices according to claim 1.

5. The magnetic wall utilization type analog memory device according to claim 1, further comprising a current controlling part which is configured to flow a current between the magnetization fixed layer and a region of the magnetic wall driving layer in which magnetization is oriented in the second direction reversed with respect to the first direction when reading is performed.

6. A magnetic wall utilization type analog memory comprising a plurality of magnetic wall utilization type analog memory devices according to claim 1.

7. A nonvolatile logic circuit comprising:
    a magnetic wall utilization type analog memory in which magnetic wall utilization type analog memory devices according to claim 1 are disposed in the form of an array; and
    an STT-MRAM positioned inside or outside the array,
    wherein the nonvolatile logic circuit has a storage function and a logic function and includes the magnetic wall utilization type analog memory devices and the STT-MRAM as the storage function.

8. A magnetic neuro device comprising:
    the magnetic wall utilization type analog memory device according to claim 1,
    wherein the magnetic wall driving layer has a first storage part extending in a longitudinal direction, and a second storage part and a third storage part having the first storage part interposed therebetween; and
    a current source having a control circuit which is configured to control flowing of a writing current capable of sequentially shifting a magnetic wall such that the magnetic wall stops in all of the first storage part, the second storage part and the third storage part at least once.

9. A magnetic wall utilization type analog memory device according to claim 1,
    wherein the spin-orbit torque wiring contains a non-magnetic metal as a main component.

10. A magnetic wall utilization type analog memory device according to claim 1,
    wherein the spin-orbit torque wiring contains a topological insulator as a main component.

11. A magnetic wall utilization type analog memory device comprising:
    a magnetization fixed layer having a magnetization oriented in a first direction;
    a non-magnetic layer provided on one side of the magnetization fixed layer;
    a magnetic wall driving layer provided on the magnetization fixed layer with the non-magnetic layer interposed therebetween; and
    a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer,
    wherein at least one of the first magnetization supplying part and the second magnetization supplying part is a magnetic field application wiring which is electrically insulated from the magnetic wall driving layer and extends in a direction intersecting the magnetic wall driving layer.

12. The magnetic wall utilization type analog memory device according to claim 11, wherein the magnetic field application wiring is disposed to be able to supply in-plane magnetization of the magnetic wall driving layer.

13. The magnetic wall utilization type analog memory device according to claim 12, further comprising a current controlling part which is configured to flow a current between the magnetization fixed layer and a region of the magnetic wall driving layer in which magnetization is oriented in the second direction reversed with respect to the first direction when reading is performed.

14. A magnetic wall utilization type analog memory comprising a plurality of magnetic wall utilization type analog memory devices according to claim 12.

15. The magnetic wall utilization type analog memory device according to claim 11,
    wherein the magnetic field application wire is disposed to be able to supply surface-perpendicular magnetization of the magnetic wall driving layer.

16. The magnetic wall utilization type analog memory device according to claim 15, further comprising a current controlling part which is configured to flow a current between the magnetization fixed layer and a region of the magnetic wall driving layer in which magnetization is oriented in the second direction reversed with respect to the first direction when reading is performed.

17. A magnetic wall utilization type analog memory comprising a plurality of magnetic wall utilization type analog memory devices according to claim 15.

18. The magnetic wall utilization type analog memory device according to claim 11, further comprising a current controlling part which is configured to flow a current between the magnetization fixed layer and a region of the magnetic wall driving layer in which magnetization is oriented in the second direction reversed with respect to the first direction when reading is performed.

19. A magnetic wall utilization type analog memory comprising a plurality of magnetic wall utilization type analog memory devices according to claim 11.

20. A magnetic wall utilization type analog memory device comprising:
 a magnetization fixed layer having a magnetization oriented in a first direction;
 a non-magnetic layer provided on one side of the magnetization fixed layer;
 a magnetic wall driving layer provided on the magnetization fixed layer with the non-magnetic layer interposed therebetween; and
 a first magnetization supplying part which is configured to supply magnetization oriented in the first direction to the magnetic wall driving layer and a second magnetization supplying part which is configured to supply magnetization oriented in a second direction reversed with respect to the first direction to the magnetic wall driving layer,
 wherein at least one of the first magnetization supplying part and the second magnetization supplying part is a voltage applying part which is connected to the magnetic wall driving layer through an insulating layer.

21. The magnetic wall utilization type analog memory device according to claim 20, further comprising a current controlling part which is configured to flow a current between the magnetization fixed layer and a region of the magnetic wall driving layer in which magnetization is oriented in the second direction reversed with respect to the first direction when reading is performed.

22. A magnetic wall utilization type analog memory comprising a plurality of magnetic wall utilization type analog memory devices according to claim 20.

* * * * *